(12) United States Patent
Wang et al.

(10) Patent No.: US 7,117,143 B2
(45) Date of Patent: Oct. 3, 2006

(54) CLOCK DISTRIBUTION IN A CIRCUIT EMULATOR

(75) Inventors: Ming Yang Wang, LaFayette, CA (US); Sweyyan Shei, Cupertino, CA (US); Vincent Chiu, Fremont, CA (US)

(73) Assignee: Fortelink, Inc., Fremont, CA (US)

( * ) Notice: Subject to any disclaimer, the term of this patent is extended or adjusted under 35 U.S.C. 154(b) by 460 days.

(21) Appl. No.: 10/735,341

(22) Filed: Dec. 11, 2003

(65) Prior Publication Data
US 2005/0131670 A1 Jun. 16, 2005

(51) Int. Cl.
*G06F 9/455* (2006.01)
(52) U.S. Cl. ............ 703/25; 716/4; 716/2; 716/5; 716/6; 703/13; 703/23; 713/400
(58) Field of Classification Search ............ 703/25
See application file for complete search history.

(56) References Cited

U.S. PATENT DOCUMENTS 6,009,531 A * 12/1999 Selvidge et al. ............ 713/400
6,301,553 B1 * 10/2001 Burgun et al. ............... 703/15
7,003,746 B1 * 2/2006 Hyduke et al. ............... 716/4

* cited by examiner

*Primary Examiner*—Kamini Shah
*Assistant Examiner*—Shambhavi Patel
(74) *Attorney, Agent, or Firm*—Daniel J. Bedell; Smith-Hill and Bedell

(57) ABSTRACT

Before using a netlist description of an integrated circuit as a basis for programming a circuit emulator, a clock analysis tool analyzes the netlist to identify synchronizing circuits including clocked devices ("clock sinks") such a flip-flops, registers and latches for synchronizing communication between blocks of logic within the IC. The tool initially classifies the clock signal input to each clock sink according to its clock domain, sub-domain and phase. The tool then classifies each synchronizing circuit according to relationships between the classifications of the clock signals it employs to clock its input and output clock sinks. The tool then determines, based on the classification of each synchronizing circuit, whether the emulator can reliably emulate that synchronizing circuit, or whether the tool should automatically modify the netlist description of the synchronizing circuit so that the emulator can emulate it. The tool also generates a warning when an emulator may not reliably emulate a synchronizing circuit and the tool cannot automatically modify it so that the emulator can reliably emulate it.

26 Claims, 10 Drawing Sheets

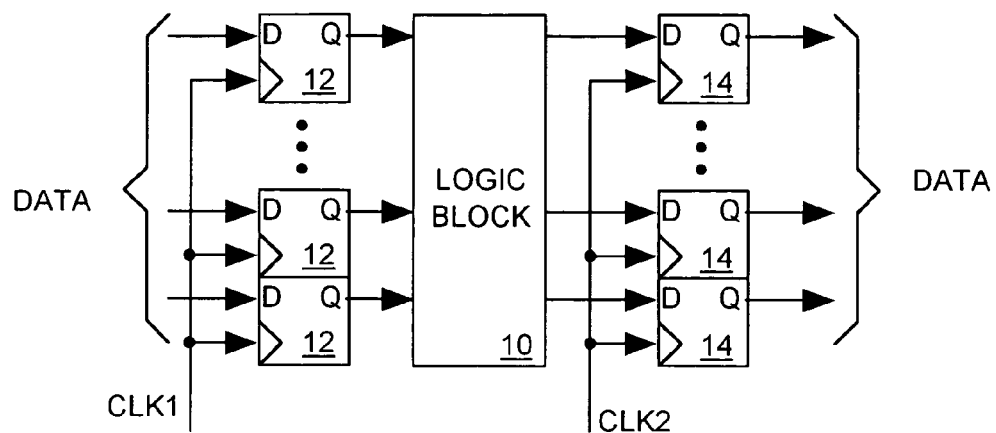
FIG. 1
(PRIOR ART)
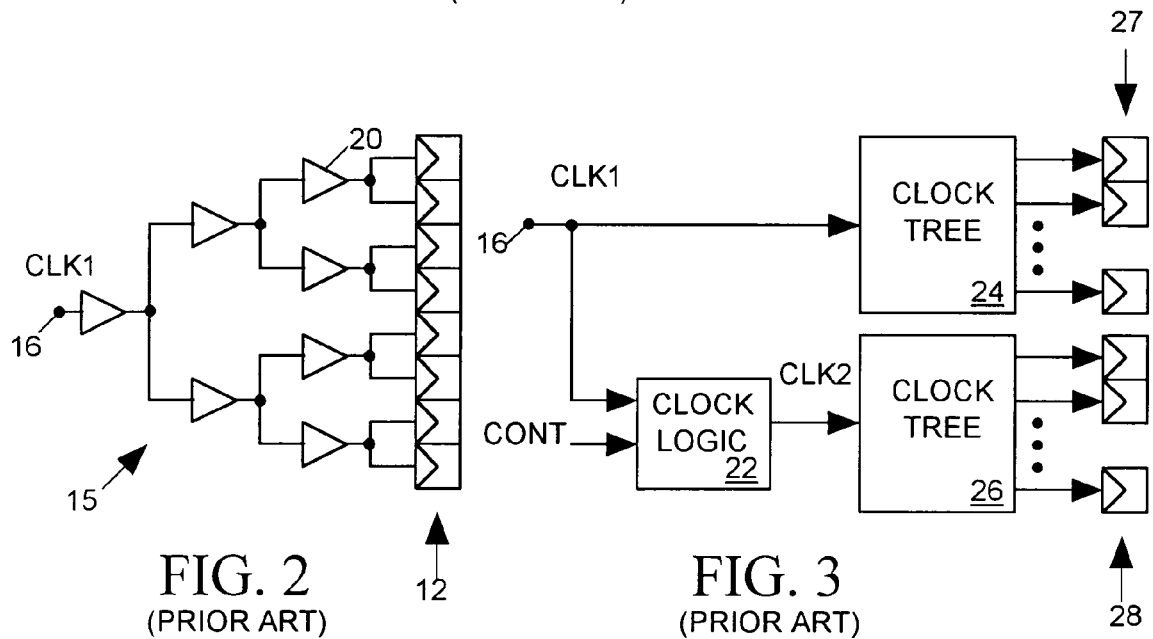
FIG. 2
(PRIOR ART)
FIG. 3
(PRIOR ART)
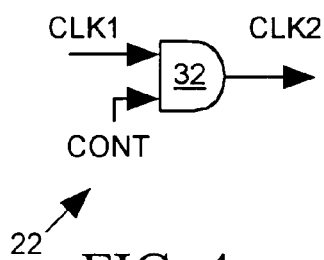
FIG. 4
(PRIOR ART)
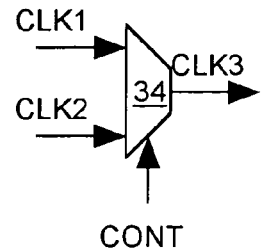
FIG. 5
(PRIOR ART)

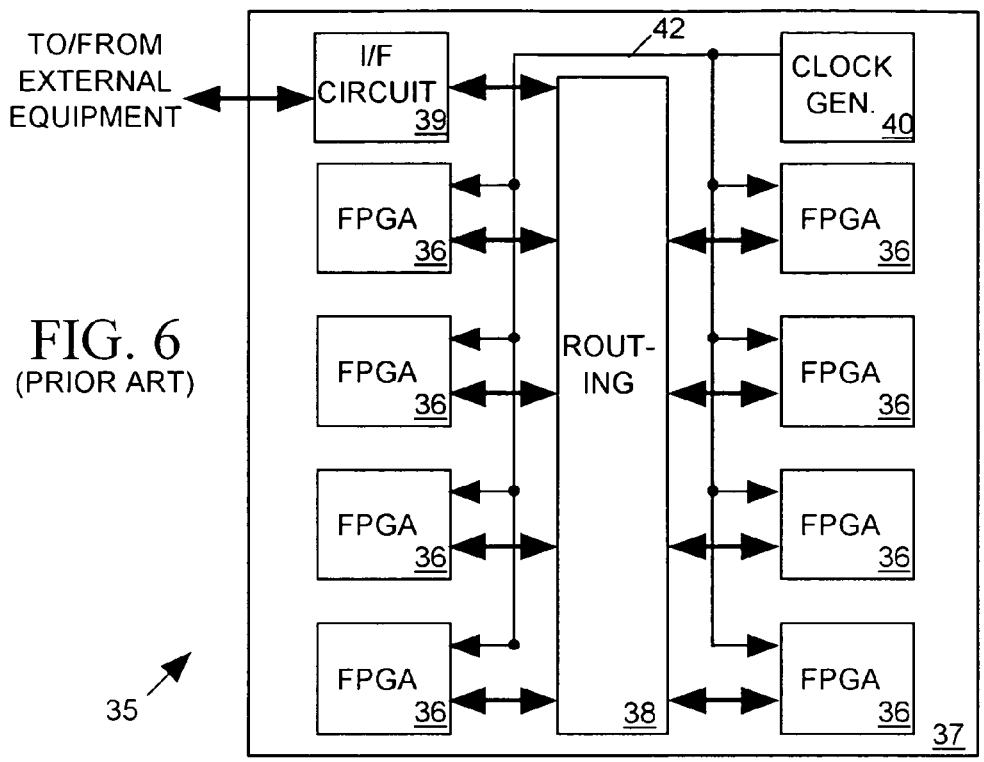
FIG. 6 (PRIOR ART)
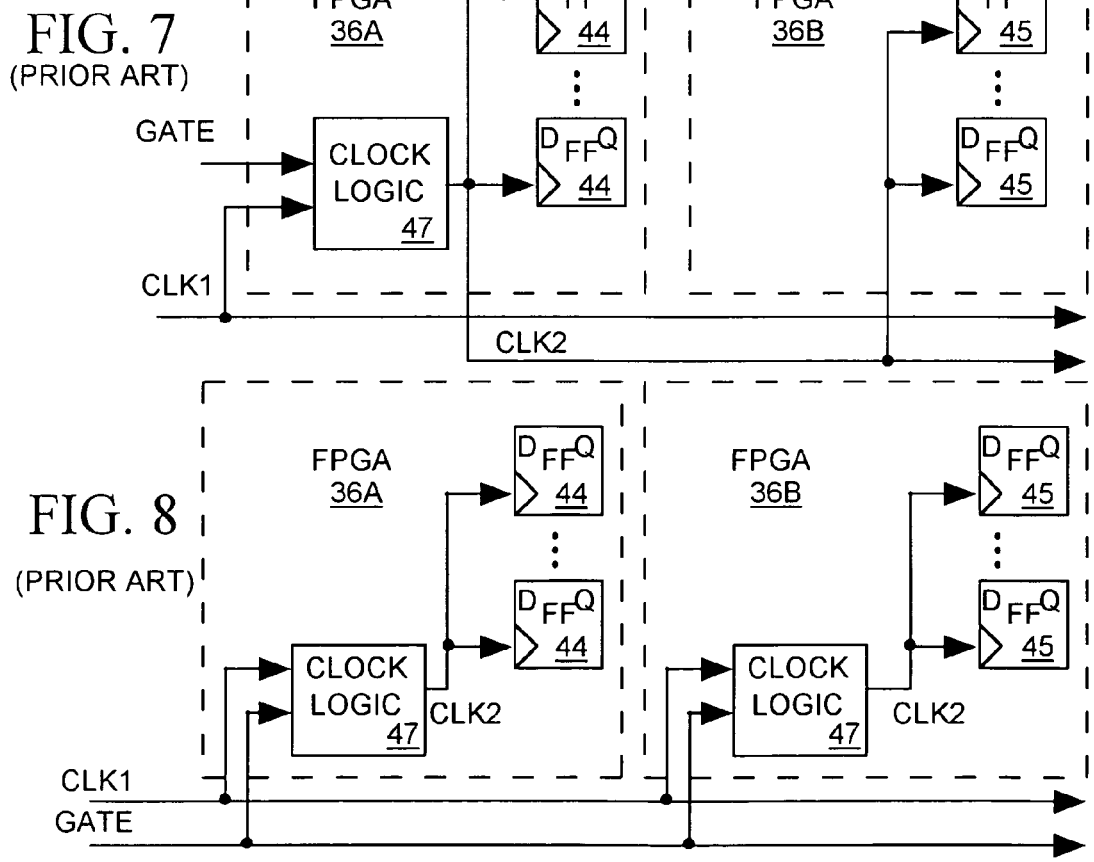
FIG. 7 (PRIOR ART)
FIG. 8 (PRIOR ART)

CLOCK DISTRIBUTION IN A CIRCUIT EMULATOR

CROSS-REFERENCE TO RELATED APPLICATIONS

This application has subject matter in common with U.S. patent application Ser. No. 10/735,342 entitled RESOURCE BOARD FOR EMULATION SYSTEM filed concurrently herewith.

BACKGROUND OF THE INVENTION

1. Field of the Invention

The present invention relates in general to integrated circuit (IC) emulators and in particular to a method for programming an emulator to distribute clock signals within an IC emulator for controlling timing of clock sinks.

2. Description of Related Art

IC Clocking

An IC designer typically generates a hardware description language (HDL) netlist describing and IC in terms of the logical relationships between the various signals to be conveyed by networks ("nets") within the IC. After creating the HDL netlist, a designer can use a synthesis tool to convert it into a gate level netlist describing the IC as a set of interconnected logic gates and other IC components ("cells") for implementing the logic described by the HDL netlist. The designer then uses placement and routing tools to generate an IC layout specifying a position of each cell within the IC and specifying how the nets are to be routed between the cells.

Most digital ICs use register transfer logic wherein blocks of logic transmit data to one another via synchronizing circuits including clocked circuit devices ("clock sinks") such as flip-flops and latches that ensure each block's input and output signals change state at predictable times. For example, FIG. 1 illustrates a block of logic 10 receiving and transmitting data signals through a synchronizing circuit including clock sinks 12 and 14 at the inputs and outputs of logic block 10. Clock sinks 12 and 14 ensure that state changes in the input and output signals of logic block 10 coincide with edges of the signals CLK1 and CLK2 clocking sinks 12 and 14.

An IC designer chooses phase relationships between edges of clock signals CLK1 and CLK2 to allow logic block 10 sufficient time after a state change in its input signals following an edge of clock signal CLK1 to appropriately adjust states of its output signals before clock signal CLK2 clocks sinks 14. For example when CLK1 and CLK2 are the same clock signal and sinks 12 and 14 are all clocked on the leading edge of that clock signal, then logic block 10 will have one cycle of the clock signal to fully respond to a change in its input signals. When CLK1 and CLK2 are the same clock signal, but sinks 12 are clocked on the leading edge that clock signal and sinks 14 are clocked on the trailing edge of the clock signal, logic block 10 will have one half cycle of the clock signal to respond to a change in its input signals. Clock signals CLK1 and CLK2 may differ, but to ensure proper phase relationships between clock signals, they are normally derived from a similar clock signal source so that edges of the two clock signals have a predictable and appropriate phase relationship.

An IC typically employs a clock tree to deliver edges of a clock signal concurrently to all sinks that receive it. FIG. 2 depicts in block diagram form a simple clock tree 15 including a network of buffers 20 for delivering a primary clock signal CLK1 from an IC input/output (IO) terminal 16 to a set of clock sinks 18. Although in this simple example clock tree 15 fans clock signal CLK1 out to only eight clock sinks 18, a typical clock tree may deliver a clock signal to thousands of clock sinks. A designer normally employs a computer-aided clock tree synthesis (CTS) tool to lay out an IC's clock trees after a placement and routing tool has established a position for each clock sink 12 within the IC. By appropriately selecting the size and position of each buffer 20 and appropriately routing the conductors interconnecting them, the CTS tool can create a balanced clock tree delivering clock signal edges to all clock sinks 18 with acceptably small timing differences ("skew") in edge arrival times at the clock sinks.

An IC may internally derive one or more "secondary" clock signals from an externally generated "primary" clock signal arriving at one of the IC's IO terminals. For example FIG. 3 shows a clock logic circuit 22 processing a primary clock signal CLK1 arriving at an IO terminal 18 of an IC to produce a secondary clock signal CLK2. Separate clock trees 24 and 26 deliver the clock signals CLK1 and CLK2 to different sets of clock sinks 27 and 28. When designing clock trees 24 and 26, a CTS tool will adjust path delays through clock trees 24 and 26 to maintain an appropriate phase relationship between the two clock signals arriving at clock sinks 12 and 14. To do so, the CTS tool must account for the path delay through clock logic circuit 22.

Clock logic circuits implement various types of logic. For example clock logic circuit 22 can be a simple inverter when the CLK1 and CLK2 signals are to be of similar frequency but dissimilar phase, or may be a divide-by-N counter when the CLK2 signal period is to be an integer multiple of CLK1. Clock logic circuit 22 can also act as a "clock gate" that can turn the CLK2 clock signal on or off depending on state(s) of one or more input control signals (CONT). For example, as illustrated in FIG. 4, clock logic circuit 22 might include only an AND gate 32. When CONT is a "1", CLK2 will have the same phase and frequency as CLK1, but when CONT is a "0", CLK2 will be continuously low (off). ICs often include gated clock signals to halt operation of a particular portion of an IC for diagnostic purposes. Clock gates providing more complicated logic can have many control inputs. A clock logic circuit may have more than one clock signal input and may selectively derive a secondary clock signal from any one of its input primary clock signals. For example as illustrated in FIG. 5 a clock logic circuit could include a multiplexer 34 for selectively deriving a secondary clock signal CLK3 from either of two input clock signals CLK1 and CLK2 depending on the state of a multiplexer control signal CONT.

Simulators and Emulators

As an IC design progresses through the HDL netlist, gate level netlist and layout stages, the designer will normally employ various tools to verify that an IC fabricated in accordance with the IC design will behave as expected. A computer-based circuit simulator creates a behavioral model of an IC based on a netlist description of the IC either at the HDL or gate level, and the simulator drives the model with simulated input signals so that the model will show how the IC's output signals would behave. Although a simulator can accurately predict the behavior of an IC based on the model, a simulator will normally require substantial amounts of computer processing time to model the behavior of a large IC over even a relatively short period of real time. To reduce processing time, designers often limit coverage of circuit simulations to relatively small custom-designed portions of an IC.

Designers have increasingly turned to circuit emulators to verify the behavior of an entire IC because a circuit emulator can do so more quickly than a circuit simulator. A circuit emulator uses programmable logic devices such as field programmable gate arrays (FPGAs) to emulate IC logic. A typical FPGA includes an array of programmable logic cells for emulating an IC's logic gates and clock sinks and includes programmable signal routing circuits for appropriately interconnecting the programmable logic cells and sinks to one another and to the FPGA's IO terminals.

FIG. 6 is a simplified plan view of a circuit emulator 35 including a circuit board 37 holding a set of eight FPGAs 36. A routing system 38, including for example traces and programmable routing devices mounted on circuit board 37, interconnect various IO terminals of FPGAs 36 with one another and with an interface circuit 39. Interface circuit 39 provides external equipment such as computers, signal generators and logic analyzers with access to IO and programming terminals of FPGAs 36. To program emulator 35 to emulate an IC, an external host computer programs FPGA 36 to emulate separate portions of the IC and programs routing system 38 to appropriately route signals between FPGAs 36 and interface circuit 39. External test equipment can then test the simulated IC by transmitting test signals to FPGA terminals via interface circuit 39 and by monitoring FPGA output signals via interface circuit 39.

In addition to emulating the logic of an IC, emulator 35 must also emulate the IC's clock trees. A clock signal generator 40 on circuit board 37 supplies one or more clock signals to FPGAs 36 through lines of a clock signal bus 42 designed to provide a uniform path distance from clock signal generator 40 to all FPGAs 36 so that clock signal edges arrive concurrently at all FPGAs 36. Clock signal paths inside FPGAs 36 forward each clock signal to various clock sinks therein, also with as little skew as possible.

Since signal path delays between clock sinks within emulator 35 can exceed signal path delays between clock sinks within the IC being emulated, emulator 35 will typically emulate an IC at somewhat lower clock frequencies than the IC being emulated will use. Lowering clock signal frequency increases the time logic blocks have to process their input signals between edges of clock signals clocking their input and output clock sinks. However, even though a circuit emulator typically operates at lower clock frequencies than the IC being emulated, it can normally emulate IC logic much more quickly than a circuit simulator can simulate it.

While clock bus 42 and the clock trees within FPGAs 36 can emulate the function of balanced clock trees within an IC for conveying primary clock signals to clock sinks, they cannot emulate balanced clock trees for conveying secondary clock signals that the IC generates internally. FIG. 7 illustrates a clock signal distribution system including a clock logic circuit 47 in an FPGA 36A deriving a secondary clock signal CLK2 from a primary clock signal CLK1. Secondary clock signal CLK2 clocks sinks 44 in FPGA 36A and sinks 45 in FPGA 36B. Clock bus 42 of FIG. 6 and an internal clock trees of FPGAs 36 can emulate a clock tree for delivering primary clock signal CLK1 to one of FPGAs 36 implementing clock logic 47 and to any other FPGA requiring the CLK1 clock signal. But clock bus 42 cannot forward a secondary clock signal CLK2 generated by one FPGA to other FPGAs. Instead, clock signal CLK2 must pass between FPGAs 36A and 36B through routing circuit 38. Since the paths from clock logic 47 to sinks 44 and 45 are not balanced, clock signal CLK2 can exhibit excessive skew.

FIG. 8 shows one prior art solution to this problem. When an IC has a secondary clock signal such as clock signal CLK2, the designer programs the emulator to replicate the clock logic circuit 47 of FIG. 7 within each FPGA 36A and 36B that is to receive the secondary clock signal so that each FPGA generates the CLK2 signal locally. Since it is not necessary for the emulator to distribute the secondary clock signal CLK2 from one FPGA to another, this approach reduces clock signal skew, at the cost the FPGA logic resources needed to replicate clock logic.

FIG. 9 illustrates a logic block 52 communicating with external circuits through a synchronizing circuit including input and output flip-flops 51 and 53 and a clock logic circuit 50 for deriving a gated clock signal CLK2 for clocking flip-flop 53 from the clock signal CLK1. When an emulator emulates the synchronizing circuit, it can use an FPGA to emulate flip-flops 51 and 53. FIG. 10 shows how a typical FPGA implements flip-flop 51 of FIG. 9 using a pair of latches 54, 55, and an inverter 56, and FIG. 11 illustrates timing relationships between the various signals of FIG. 10. Latch 54 drives signal X at its Q output to the state of signal A at D input of flip-flop 51 input while the CLK1 signal is high and holds the X signal at its current state while the CLK1 signal is low. Latch 55 drives signal B at the D output of flip-flop 51 to the state of signal X while the CLOCK signal is low and holds the X signal at its current state while the CLOCK signal is high. After sampling signal A on the trailing edge of CLK1, flip-flop 51 must hold the state of signal B long enough to allow logic block 52 time to drive its C output to the appropriate logic level. Clock logic circuit 50 must respond to the CLK1 signal edge by delivering a trailing edge of clock signal CLK2 signal to flip-flop 53 while signal C resides at its valid logic level.

FIG. 12 models signal path delays in the circuit of FIG. 9. A delay D1 models the path delay of the clock tree delivering the CLK1 signal to flip-flop 51, and a delay D2 models the total path delay from the CLK1 clock signal source to the CLK2 signal input of flip-flop 51, including the delay though clock logic circuit 50 of FIG. 9. Delay 3 models the time logic block 52 requires to drive signal C to a valid logic level in response to a change in state of signal B following an edge of the CLK1 signal. When D2<D1+D3, clock signal CLK2 will signal flip-flop 53 to sample signal C before it reaches a valid logic level. Thus D2 should be at least as large as D1+D2. However, if delay D2 is too long relative to the period of CLK1, a next edge of clock signal CLK1 may cause logic block 52 to change the state of signal C before flip-flop 53 can sample it. This is called a "hold time error" because logic block 52 fails to hold its output signal at a valid state long enough for flip-flop 53 to sample it. Thus it is necessary to control relationships between delays D1, D2 and D3 so that flip-flop 53 will always sample signal C at the right time.

A clock tree synthesis tool can accurately control the relationships between delays D1, D2 and D3, though D3 is fixed by the nature of logic block 52, because the CTS tool can control delays D1 and D2. However in an emulator, delays D1, D2 and D3 are fixed by the emulator architecture and there is no opportunity to precisely adjust any of those delays to ensure that edges of clock signals CLK1 and CLK2 clock flip-flops 51 and 53 with appropriate relative timing.

What is needed is a method for processing a netlist describing an IC to identify various kinds of clocking problems and for modifying the netlist to resolve them, where possible, so that an emulator can emulate the IC described by the netlist.

BRIEF SUMMARY OF THE INVENTION

The invention relates to a tool or method for programming a circuit emulator for emulating behavior of an integrated circuit (IC) described by a netlist when the IC includes synchronizing circuits providing clocked divides such a flip-flops, registers and latches ("clock sinks") at the inputs and outputs of various logic blocks of the IC. The invention relates in particular to a tool or method for analyzing a netlist to determine whether the emulator will be able to successfully emulate the synchronizing circuit for each logic block. When a computer-aided design tool implementing the method discovers a synchronizing circuit the emulator cannot emulate, it automatically modifies the netlist description of synchronizing circuit, when possible, to enable the emulator to emulate it. The tool otherwise warns a user when it discovers a synchronizing circuit that may be subject to emulation problems that the tool cannot resolve by modifying the netlist.

An IC receives its "primary" clock signals as inputs to an IC and derives its "secondary" clock signals from its primary clock signals. Each primary signal and each secondary clock signal derived from that primary clock signal reside in a clock "domain" associated with that primary clock signal. Each separately generated secondary clock signal also resides in a separate sub-domain of that primary clock signal's domain. The "phase" of each clock signal input to a clock sink relates to whether its rising or falling edge clocks the sink.

The tool initially processes the netlist to classify the clock signal input to each clock sink according to its clock domain, sub-domain and phase and then processes the netlist to classify each synchronizing circuit by type based on relationships between the clock signals it employs to clock its input and output clock sinks. Depending on synchronizing circuit type, the tool determines whether it is necessary to modify the synchronizing circuit or to warn the user that emulating the synchronizing circuit may be problematic.

In a "type A" synchronizing circuit, the same phase of the same clock signal "similar domain, similar sub-domain, similar phase" clocks all input and output clock sinks. Since the emulator will be able to emulate a type A synchronizing circuit, timing analysis tool 66 makes no change to the netlist description of a type A synchronizing circuit. However, if any one of its output sinks is a latch, the tool warns the user that the type A synchronizing circuit may have a design flaw.

In a "type B" synchronizing circuit, clock signals that clock the synchronizing circuit's input and output sinks are of similar domain, dissimilar subdomain and similar phase. Since the emulator cannot emulate a type B synchronizing circuit assigned to this classification, the tool therefore automatically modifies the synchronizing circuit to convert it to a type A synchronizing circuit using one of the approaches discussed above. However, if any one of the output sinks is a latch, the tool warns the user that the type A synchronizing circuit may have a design flaw.

In a "type C" synchronizing circuit the clock signals that clock the synchronizing circuit's input and output sinks are of similar domain, dissimilar sub-domain and dissimilar phase. The emulator can emulate a type C synchronizing circuit but may have to slow its system clock frequency more than it would for a type A synchronizing circuit. The tool therefore optionally may either warn the user that a reduction in emulation speed may be necessary or modify the type C synchronizing circuit to convert it type A synchronizing circuit.

In "type D" synchronizing circuit, the clock signals that clock the input and output sinks are of similar domain, similar subdomain, and dissimilar phase. Since the emulator will be able to emulate a type D synchronizing circuit, the tool does not modify the type D synchronizing circuit or issue any warnings about it.

In a "type E" synchronizing circuit, the clock signals that clock input and output sinks are of dissimilar domains. The tool warns the user when it identifies a type E synchronizing circuit.

In a "type F" synchronizing circuit, at least one of the clock signals that clock the synchronizing circuit's input and output sinks is derived from more than one primary clock signal. The tool warns the user when it encounters a type F synchronizing circuit.

In a "type G" synchronizing circuit, the signals that clock the input and output sinks are of similar domain and sub-domain. However, the signals clocking the input sinks are of "mixed phase" where at least one of the input sinks is clocked on a rising edge and at least one other of the input sinks is clocked on a falling edge. The tool warns the user when it identifies a type G synchronizing circuit.

In a "type H" synchronizing circuit, the signals that clock the input and output sinks are of similar domain, dissimilar sub-domain and of mixed phase. The tool automatically converts a type H synchronizing circuit into a type G synchronizing circuit and then warns the user that it the emulation will include a type G synchronizing circuit.

The claims appended to this specification particularly point out and distinctly claim the subject matter of the invention. However those skilled in the art will best understand both the organization and method of operation of what the applicant(s) consider to be the best mode(s) of practicing the invention by reading the remaining portions of the specification in view of the accompanying drawing(s) wherein like reference characters refer to like elements.

BRIEF DESCRIPTION OF THE DRAWINGS

FIG. 1 illustrates a clocking system for a block of logic within an IC in block diagram form.

FIGS. 2 and 3 illustrate prior art clock signal distribution system in block diagram form.

FIGS. 4 and 5 are block diagrams illustrating prior art clock logic circuits.

FIG. 6 is a block diagram illustrating a prior art circuit emulator.

FIGS. 7 and 8 are block diagrams illustrating prior art clock distribution systems.

DETAILED DESCRIPTION OF THE INVENTION

Various blocks of logic within an integrated circuit (IC) may communicate with one another through synchronizing circuits including clocked devices ("clock sinks") at the inputs and outputs of the logic blocks. The invention relates to a system for programming an emulator for emulating behavior of such an IC based on a netlist description of the IC. In particular, the invention relates to a method for processing the netlist to identify the IC's synchronizing circuits to determine whether the emulator will be able to successfully emulate each synchronizing circuit. When it finds that the emulator will not be able to emulate a synchronizing circuit, a computer-based tool implementing the method modifies the netlist description of the synchronizing circuit, when possible, so that the emulator can emulate it. Otherwise, the tool will notify its user that the emulator may not be able to successfully emulate the synchronizing circuit.

A conventional general-purpose computer programmed by software stored on computer-readable media suitably implements the clock analysis tool. Suitable computer-readable media for storing software include, but are not limited to, compact disks, floppy disks, hard disks, and random access or read only memory. While the specification describes at least one exemplary embodiment of the invention considered a best mode of practicing the invention, the invention is not necessarily limited to the exemplary embodiment(s) described below or to the manner in which the exemplary embodiments operate.

Figure 9:
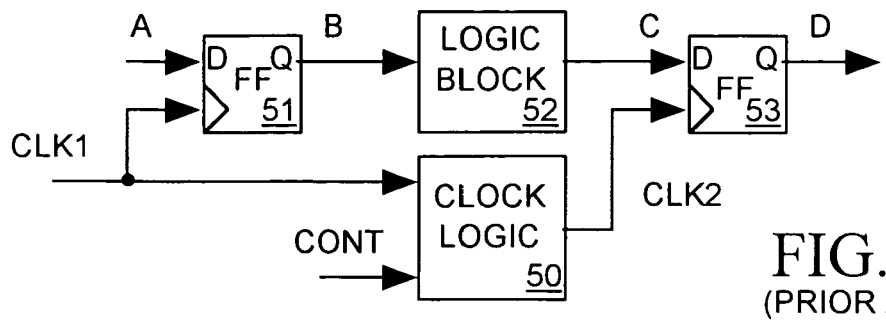
FIG. 9 is a block diagram illustrating a prior art clocking system for a logic block.
Figure 10:
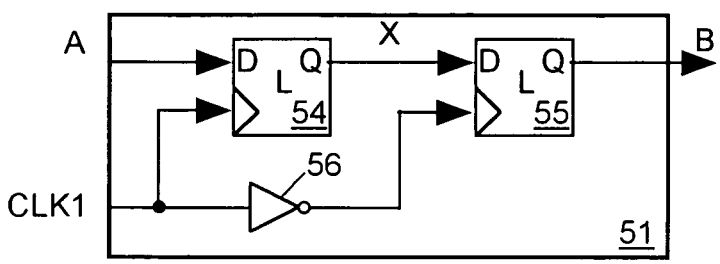
FIG. 10 illustrates a prior art flip-flop in block diagram form.
Figure 11:
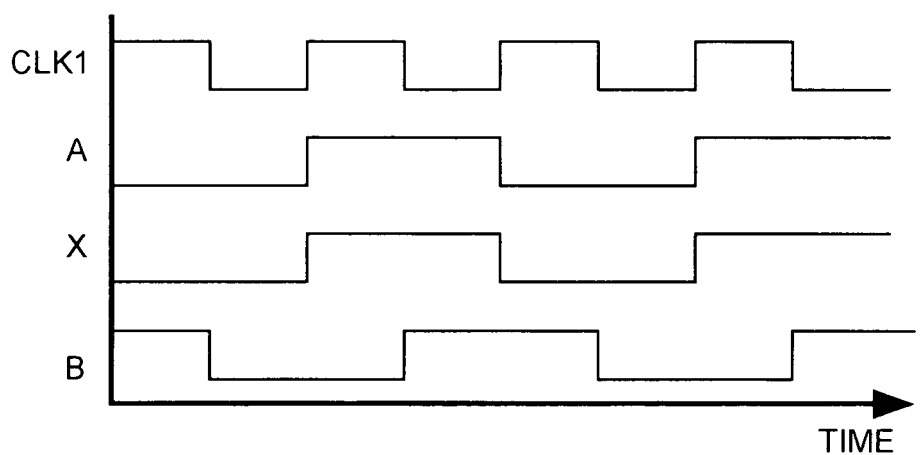
FIG. 11 is a timing diagram illustrating behavior of signals of the flip-flop of FIG. 10.
Figure 12:
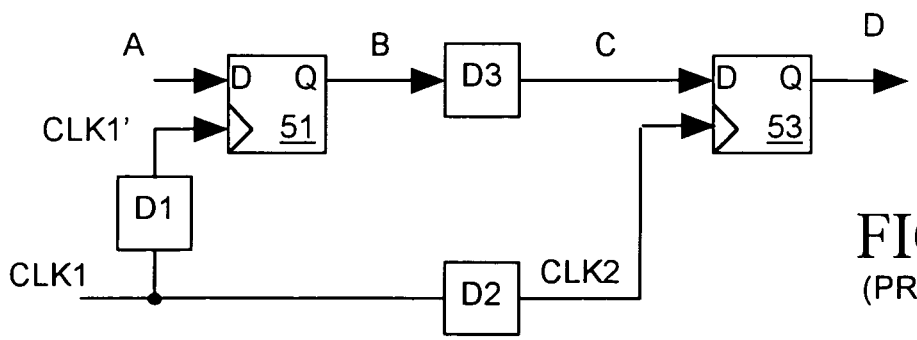
FIG. 12 is a timing model of the clocking system of FIG. 9.
Figure 13:
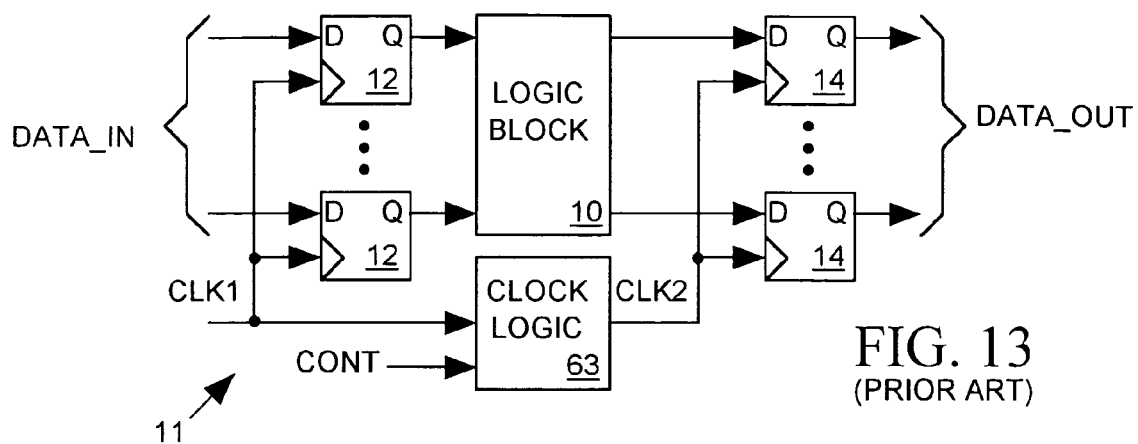
FIG. 13 illustrates a prior art clocking system for a logic block in block diagram form.

FIG. 13 illustrates a logic block 10 within an IC that communicates with other logic blocks within the IC through a synchronizing circuit 11 including a set of clock sinks 12 and 14, such as latches or flip-flops, clocked by clock signals CLK1 and CLK2. In this example, synchronizing circuit 11 includes a clock logic circuit 63 deriving clock signal CLK2 from clock signal CLK1. One or more control signal inputs to clock logic circuit 63 control when clock signal CLK2 is active. When input clock sinks 12 change states of signal inputs to logic block 10 in response to an edge of clock signal CLK1, logic block 10 responds by appropriately adjusting states of data inputs to output sinks 14. An edge of clock signal CLK2 signal thereafter clocks sinks 14 so that they sample states of their input data signals to produce data passed to other logic blocks. A netlist for an IC containing the circuit of FIG. 13 will reference sinks 12 and 14 and the gates forming logic block 10 and clock logic 63, will name each network ("net") that is to convey signals between those sinks and gates, and will indicate which device terminals are to be connected to each net.

A "clock tree" is a network within an IC for conveying a clock signal to the various sinks the clock signal clocks. An IC implementing the circuit of FIG. 13 will include one clock tree for concurrently delivering edges of clock signal CLK1 from its source to all clock sinks 12 and a separate clock tree for concurrently delivering edges of clock signal CLK2 from clock logic circuit 63 to all clock sinks 14. In addition to delivering their clock signal edges concurrently to their respective clock sinks, the two clock trees must also carefully control phase relationship between clock signals CLK1 and CLK2. If the delay between edges of clock signals CLK1 and CLK2 is too long or too short, sinks 14 could sample the output signals of logic block 10 when they are transitioning between valid logic levels rather than when they reside at valid logic levels, and in such case, the data output of flip-flops 14 will be invalid. Thus, when designing the clock trees for delivering clock signals CLK1 and CLK2 to sinks 12 and 14 within an IC, a clock tree synthesis (CTS) tool will adjust path delays through the two clock trees to provide an appropriate phase relationship between edges of those two clock signals.

Figure 14:
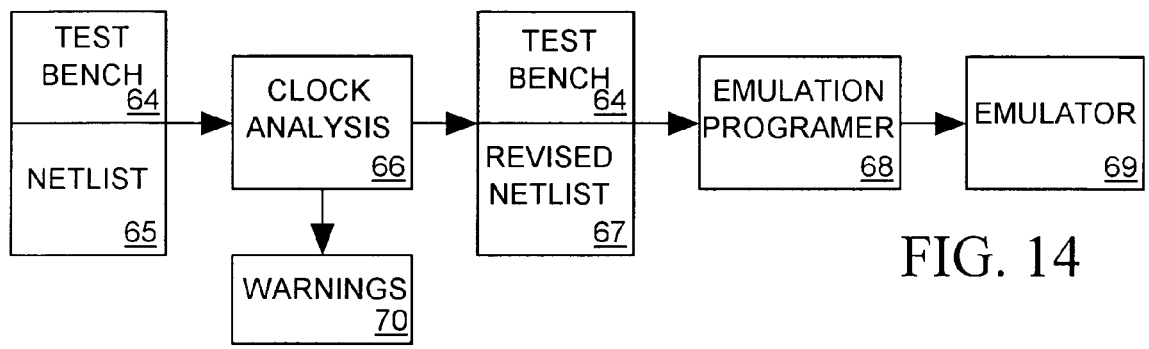
FIG. 14 is a data flow diagram illustrating a method in accordance with the invention for programming a circuit emulator.

As illustrated in FIG. 14, the invention relates to an emulator 69 for emulating an IC, including its logic blocks, its clock synchronizing circuits, and its clock trees. A netlist 65, forming part of a test bench 64, describes an IC to be emulated. Other portions of test bench 64 describe how the emulated IC is to be tested. When an IC emulator emulates an IC it must also ensure that edges of each clock signal arrive concurrently at all sinks clocked by that clock signal and must ensure that clock signals clocking a synchronizing circuit's input and output sinks have an appropriate phase relationship. As discussed below, due to inherent limitations on the emulator's ability to adjust phase relationships between clock signals, emulator 69 may not be able to directly emulate every synchronizing circuit described by netlist 65. But a computer-aided clock analysis tool 66 implementing a method in accordance with the invention processes netlist 65 to identify problematic synchronizing circuits, and when possible, revises the netlist description of problematic synchronizing circuits so that emulator 69 can emulate them. An emulator programming tool 68 then processes the test bench 64 including the revised netlist 67 to develop a program for emulator 69. When clock analysis tool 66 identifies a problem with a synchronizing circuit described by netlist 65 that it cannot resolve by modifying the netlist, it provides a warning 70 to its user identifying that synchronizing circuit.

Figure 15:
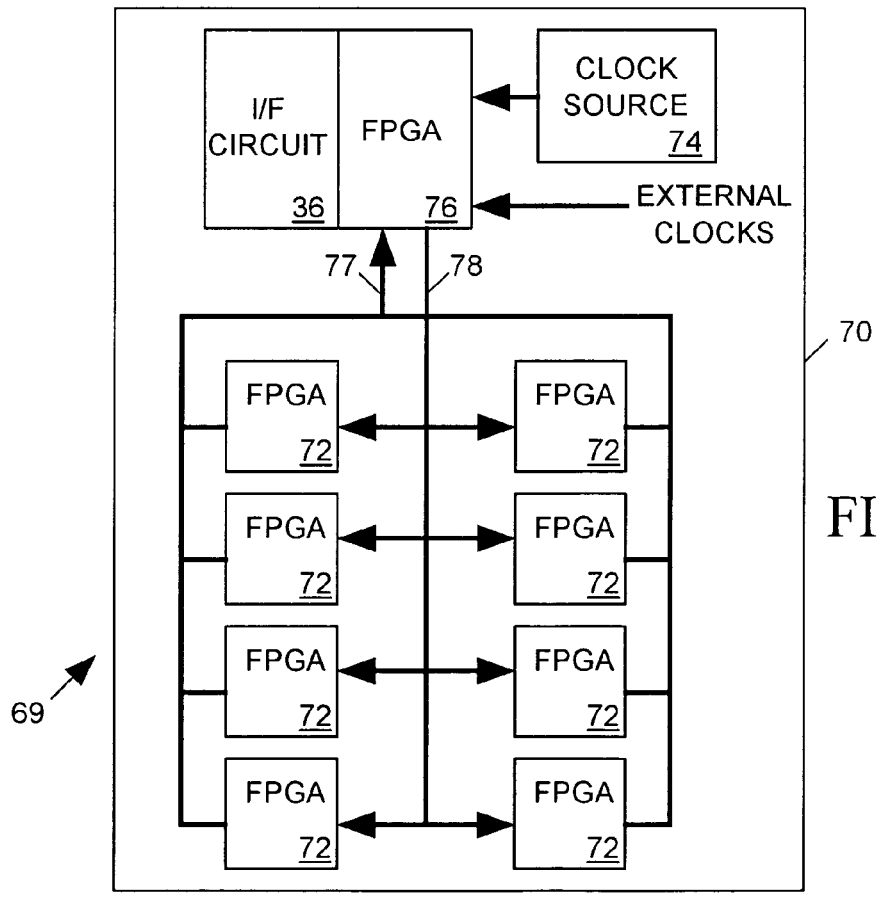
FIG. 15 is a block diagram illustrating a circuit emulator in accordance with the invention.

FIG. 15 is a block diagram of a circuit board 70 implementing emulation system 69 of FIG. 14. U.S. Patent Publication 2004/0254906 entitled RESOURCE BOARD FOR EMULATION SYSTEM based on U.S. patent application Ser. No. 10/735,342 filed Dec. 11, 2003, and incorporated herein by reference, describes circuit board 70 in detail. A set of field programmable gate arrays (FPGAs) 72 for emulating IC logic reside on circuit board 70, and conductors (not shown) interconnect some of the input/output (IO) terminals of each FPGA 72 to IO terminals of each of the other FPGAs 72. An interface circuit 38 provides external equipment with access to other IO terminals and to programming terminals of each FPGA 72. A clock source 74 supplies a set of clock signals of various frequencies to another FFGA 76 programmed to generate both primary and secondary clock signals for the emulated IO using the clock signals from clock source 74 as timing references. FPGA 76 may also use clock signals generated by equipment external to circuit board 70 as timing references.

A "primary" clock signal is a clock signal the netlist indicates is to be supplied to the IC from an external source while a "secondary" clock signal is any clock signal the IC is to generate internally using one or more other clock signals as a timing reference. For example, in FIG. 13, clock signal CLK1 could be a primary clock signal if it originates outside the IC but would be a secondary clock signal if the IC derives it from another clock signal. Clock signal CLK2 of FIG. 13 is a secondary clock signal because a clock logic circuit 63 within the IC derives clock signal CLK2 from clock signal CLK1.

FPGA 76 of FIG. 15 receives reference clock signals from clock source 74 or from sources external to circuit board 70, generates all primary and secondary clock signals needed during an emulation process, and transmits them to FPGAs 72 via separate lines of a clock bus 78. The lines of clock bus 78 provide uniform path distances from FPGA 76 to each FPGA 72 to ensure that each clock signal edge arrives at all FPGAs 72 with relatively little variation in timing (skew). All FPGAs 72 include internal signal paths that forward the clock signals they receive to their internal clock sinks with substantially the same path delay so that all primary and secondary clock signals exhibit relatively little timing skew. Thus, all primary and secondary clock signal edges have substantially the same path delay between FPGA 76 and each receiving clock sink within FPGAs 72. The emulator may use a set of buses 77 to convey control signals from FPGAs 72 to FPGA 78 for use as control inputs to clock gating circuits implemented within FPGA 76.

A netlist describing an IC containing the circuit of FIG. 13 will describe the clock logic circuit 63 deriving CLK2 from CLK1. Gates forming clock logic circuit 63 will add a delay between CLK1 and CLK2. Therefore, a clock tree synthesis tool that designs clock trees within an IC for delivering the CLK1 and CLK2 signals to sinks 12 and 14 can adjust the delay through the clock tree for CLK2 to compensate for the delay through logic circuit 53, thereby to maintain a proper phase relationship between CLK1 and CLK2. But in emulator 69, clock tree signal path delays are fixed by the emulator architecture, and the user cannot adjust them to compensate for delays through clock logic circuit 63. To resolve this problem, clock analysis tool 66 of FIG. 14 revises synchronizing circuit 11 so that the same clock signal (CLK1) clocks the synchronizing circuit's input and output clock sinks 12 and 14. With the period between clocking of sinks 12 and 14 now being a function only of the period of the CLK1 signal, rather than a function of timing relationships between the CLK1 and CLK2 signals, the period logic block 10 has to respond to its input signal can be adjusted simply by adjusting the period of the CLK1 signal. Thus during the emulation, with the CLK1 signal period set sufficiently long, logic block 10 will have sufficient time to adjust its output signals in response to its input signal state changes.

Figure 16:
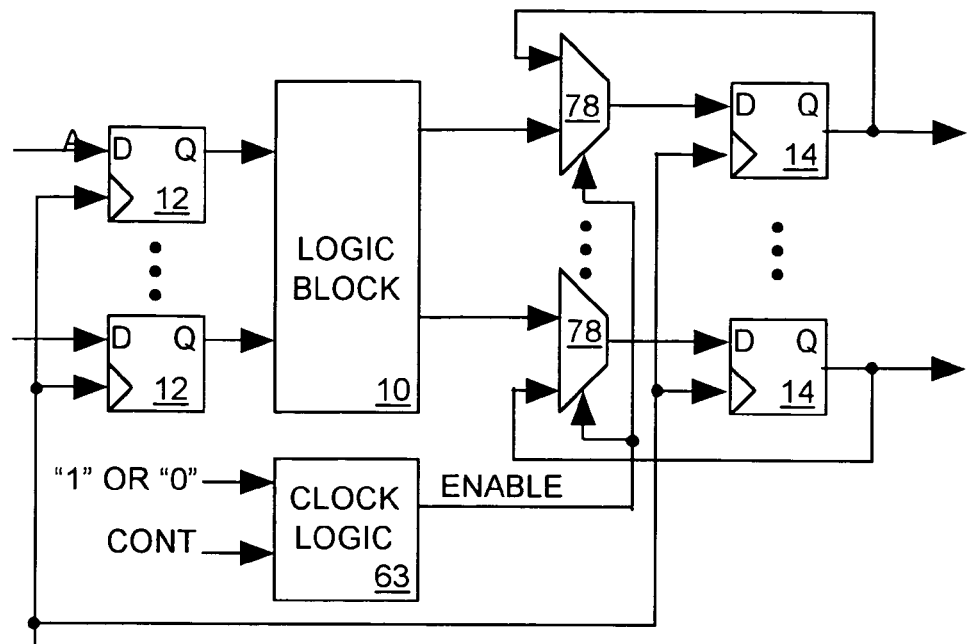
FIGS. 16–20 are block diagrams illustrating clocking systems for a logic block within an IC.

FIG. 16 shows how clock analysis tool 66 can modify the synchronizing circuit 11 of FIG. 13. Note that in FIG. 16 and clock signal CLK1, rather than clock signal CLK2, now clocks sinks 14. The output ENABLE no longer acts as a clock signal, but instead controls a set of multiplexers 78 residing between logic block 10 and output sinks 14. Each multiplexer 78 feeds the Q output of a corresponding one of sinks 14 to its D input when the ENABLE signal is false and otherwise delivers an output of logic block 10 to its corresponding sink 14 when the ENABLE signal is true. Depending on the internal logic of clock logic circuit 63, it now receives either a hardwired "1" or "0" instead of clock signal CLK1. Clock analysis tool 66 selects the "1" or "0" state of the hardwired input signal of clock logic circuit 63 so that the ENABLE signal is true whenever the CONT input would have enabled the CLK2 signal of FIG. 13 and false whenever the CONT input would have disabled the CLK2 signal.

When the CONT signal sets the ENABLE signal false, the D inputs and Q outputs of sinks 14 remain unchanged even though CLK1 clocks those sinks and even though the outputs of logic block 10 may change state. When the CONT signal sets the ENABLE signal true, the outputs of logic block 10 drive the data inputs of output sinks 14, and sinks 14 update their Q outputs to match their D inputs whenever the clock signal CLK1 clocks sinks 14.

Each multiplexer 78 and its corresponding clock sink 14 form an enabled clock sink that is clocked by the CLK1 signal when the ENABLE signal is true and that otherwise holds its output at its current state when the ENABLE signal is false.

The emulator's clock signal distribution system ensures that edges of the CLK1 signal arrive at flip-flops 12 and 14 with very little skew, and when the ENABLE signal is true, logic block 10 has one full cycle of the CLK1 signal to drive the D input to flip-flops 14 to valid logic levels after clock signal CLK1 clocks flip-flops 12. Thus, the circuit of FIG. 16 will operate correctly if logic block 10 can fully respond to a change in its input signal within one cycle of the CLK1 signal. If logic block 10 cannot respond quickly enough, the emulation system need only reduce the frequency of clock signal CLK1 to increase the period between its edges. To maintain the proper relationship between clock signal CLK1 and all other clock signals, the user will also have to proportionately decrease the frequency of all other clock signals. Thus by converting the circuit of FIG. 13 to the circuit of FIG. 16, clock analysis tool 66 of FIG. 15 replaces a clocking system for which the emulator cannot adequately control edge timing relationships with a clock system which the emulator can adequately control edge timing relationships.

Figure 17:
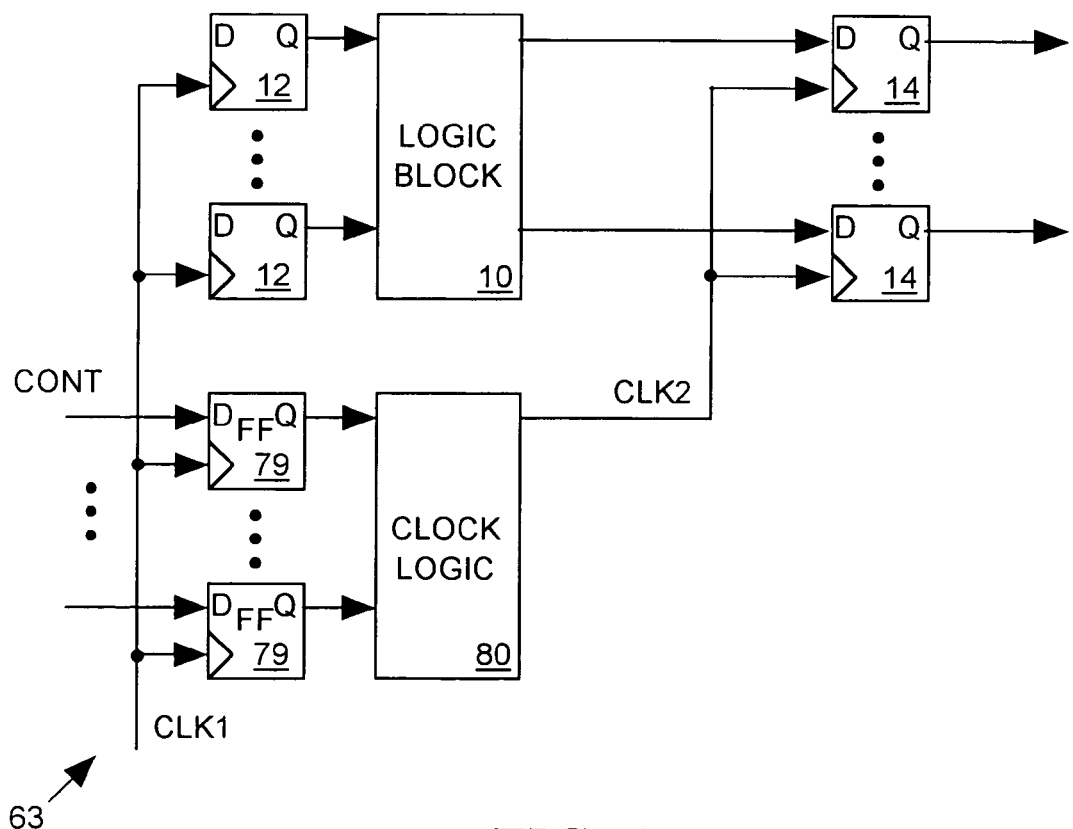

FIG. 17 depicts a "data as clock" synchronizing circuit 63 for a logic block 10. In addition to input sinks 12 clocked by clock signal CLK1 and output sinks 14 clocked by clock signal CLK2, synchronizing circuit 63 includes a pair of flip-flops 79 and a clock logic circuit 80. Flip-flops 79, clocked by clock signal CLK1, clock control data signals CONT into clock logic circuit 80 which produces the CLK2 signal as a logical combination of the CONT data. The CONT data controls the state of clock signal CLK2, but flip-flops 79 synchronize state changes in the CONT data to edges of the CLK1 signal, thereby synchronizing edges of the CLK2 signal to edges of the CLK1 signal. In addition to presenting hold time problems during emulation, this type of synchronizing circuit can produce glitches in the CLK2 signal when there is variation in path delays through flip-flops 79 and clock logic circuit 80. Such glitches can cause CLK2 signal to erroneously clock output sinks 14.

Figure 18:
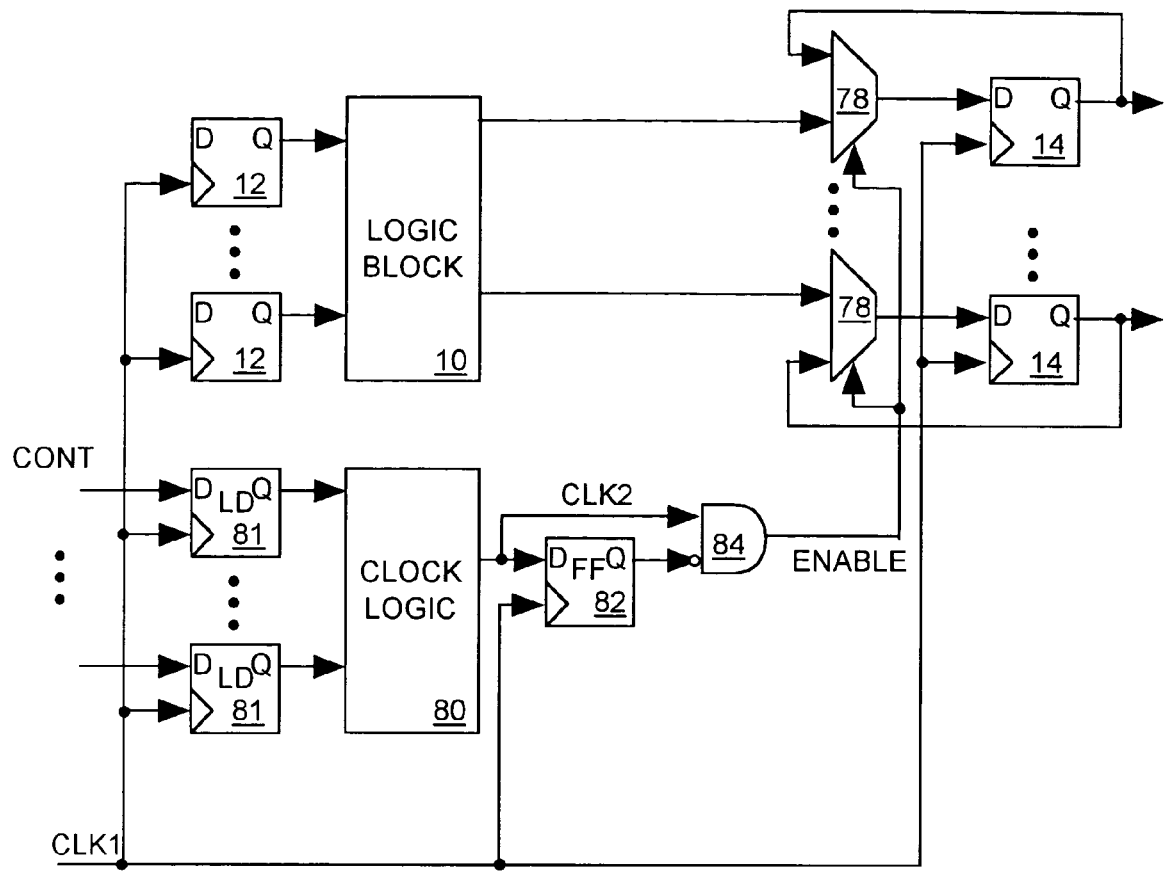

FIG. 18 shows how a clock analysis tool in accordance with the invention can modify the netlist description of synchronizing circuit 63 of FIG. 17 to eliminate false clocking of clock sinks 14. Note that a multiplexer 78 is between logic block 10 and each flip-flop 14, and that flip-flops 14 are now clocked by CLK1. Note also that the clock analysis tool has replaced flip-flops 79 of FIG. 17 with latches 81, and has provided a flip-flop 82 and an AND gate 84 to process the CLK2 output of logic circuit 80 to produce an ENABLE signal for controlling multiplexers 78.

Although the CLK2 signal of FIG. 18 can have glitches due to small differences in signal path delays through latches 81 and logic 80, flip-flop 82 and AND gate 84 eliminate glitches in the ENABLE signal controlling multiplexers 78. Converting flip-flops 79 of FIG. 17 to the latches 81 of FIG. 18 reduces the path delay between CLK1 and logic circuit 80 by one half cycle of clock signal CLK1. This half cycle delay reduction allows flip-flop 82 and AND gate 84 to clock state changes in the ENABLE signal with a one half cycle delay. Glitches in the CLK2 signal will occur within the first half cycle of the CLK1 signal. Thus, by delaying the clocking of the ENABLE signal by one half cycle of the CLK1 signal we avoid passing glitches in the CLK2 signal through to the ENABLE signal.

Figure 19:
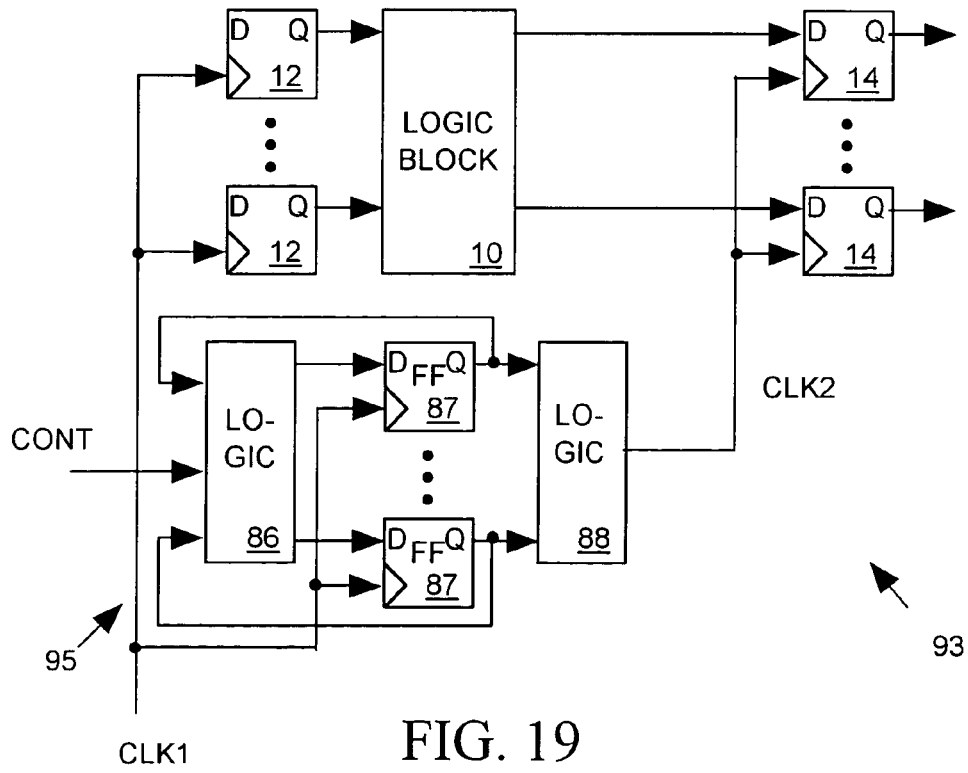

FIG. 19 illustrates another type of "data as clock" synchronizing circuit 93 including input clock sinks 12 clocked by clock signal CLK1 and output clock sinks 14 clocked by a clock signal CLK2. Synchronizing circuit 93 also includes a state machine 95 clocked by the CLK1 signal for controlling edges of the CLK2 signal in response to control data CONT supplied as input to the state machine. State machine 95 includes a logic circuit 86 processing the CONT data to supply inputs to a set of flip-flops 87 clocked by clock signal CLK1. Another logic circuit 88 processes the Q outputs of flip-flops 87 to produce clock signal CLK2. Timing of edges of the CLK2 signal are nominally occur at predictable times following edges of the CLK1 signal, but variations in path delays through flip-flops 87 and logic circuit 88 can cause glitches in the CLK2 signal.

Figure 20:
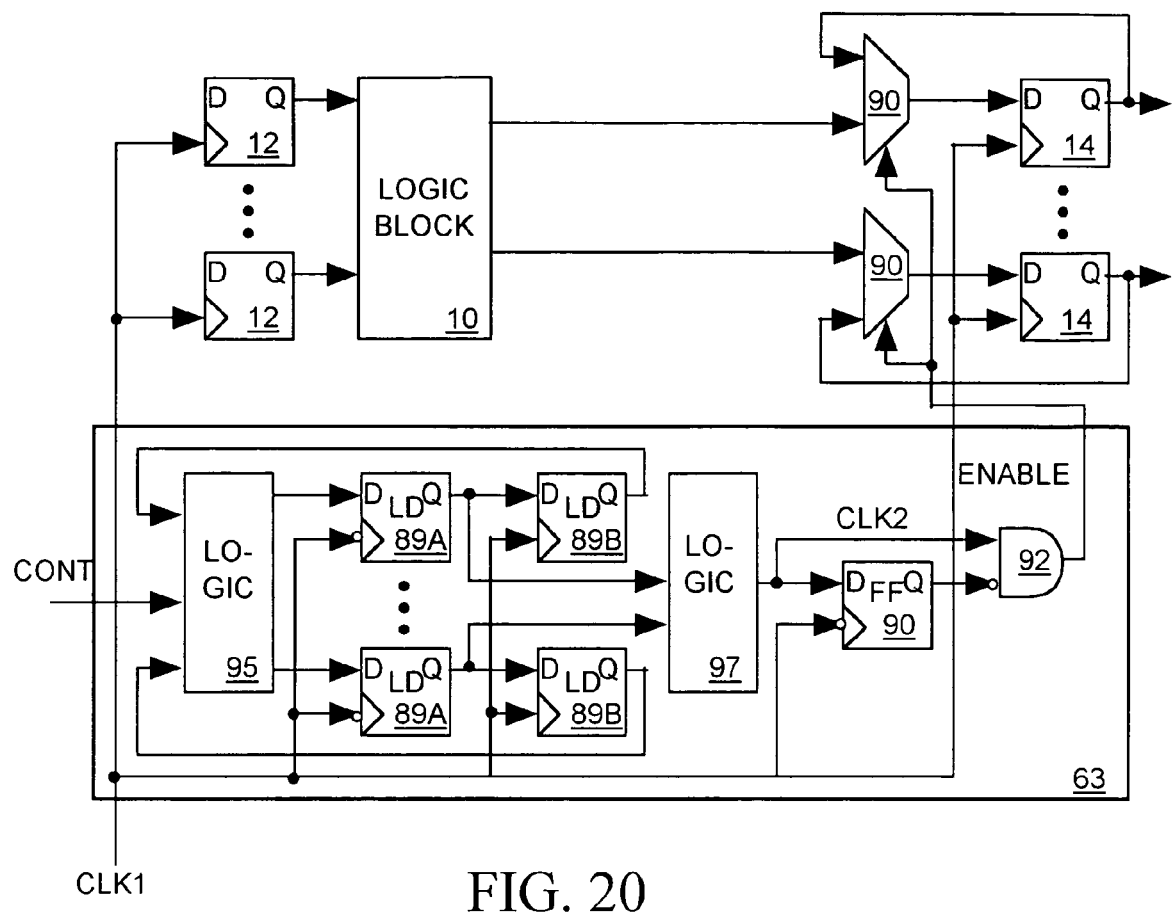

FIG. 20 illustrates one way a clock analysis tool in accordance with the invention can modify the netlist description of synchronizing circuit 95 of FIG. 17 to eliminate glitches and hold time problems. The tool inserts multiplexers 78 between logic block 10 and flip-flops 14, clocks sinks 14 with CLK1 instead of CLK2, replaces flip-flops 87 of FIG. 19 with latches 89, and provides a flip-flop 90 and an AND gate 92 to remove glitches from the CLK2 output of logic circuit 80 to provide an ENABLE input to multiplexers 78.

When clock analysis tool 66 of FIG. 13 processes netlist 65, it identifies logic blocks that transmit and receive input and output signals through clock sinks. For each identified logic block, it investigates the relationships between the signals that clock its input and output clock sinks to determine whether to revise the clocking arrangement for that logic block to enable emulator 69 to emulate the logic block's clocking system. When the timing analysis tool determines that it must revise a clocking arrangement, it does so. Otherwise, it warns the user when it discovers a potential timing problem it cannot resolve.

As part of its analysis, clock analysis tool 66 classifies each primary clock signal and any secondary clock signal derived from the primary clock signal as residing in the "domain" of that primary clock signal. Clock analysis tool 66 also classifies each separately generated secondary clock signal as residing in its own "sub-domain". Clock analysis tool 66 also classifies the clock signal input to each sink according to its "phase", indicating the particular phase with which the clock signal clocks that sink. Thus, clock analysis tool 66 completely classifies the clock signal input to each clock sink according to its domain, sub-domain and phase.

Figure 21:
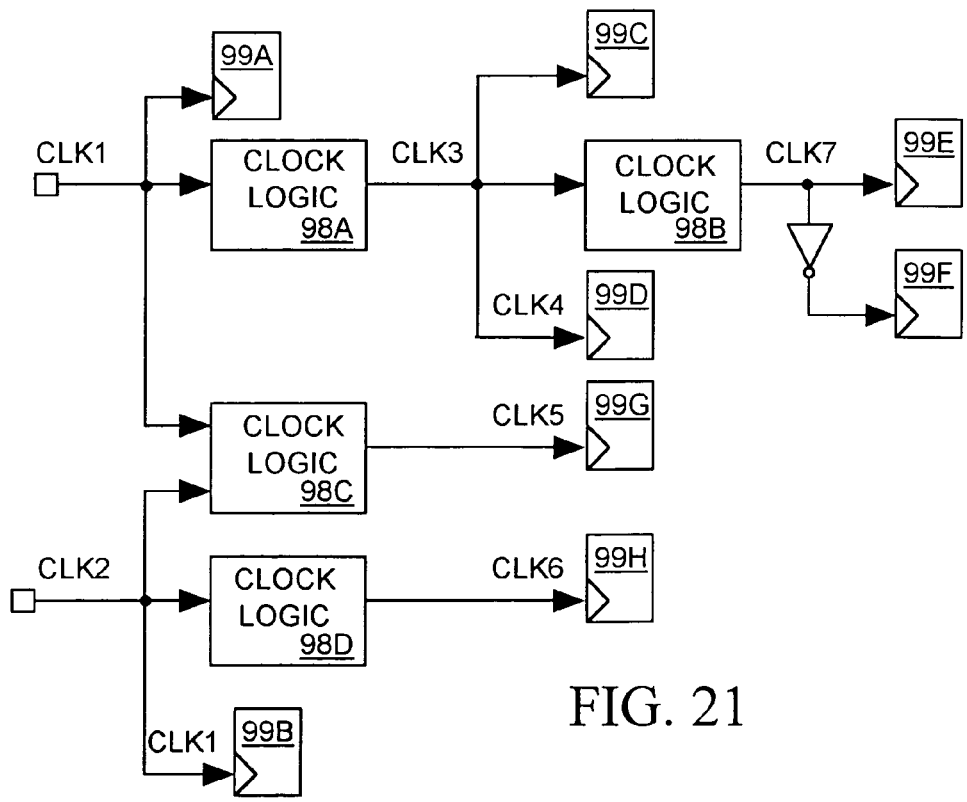
FIG. 21 is a block diagram illustrating a clock signal distribution system for an IC.

FIG. 21 is a block diagram illustrating a set of clock logic circuits 98A–98D for deriving a set of secondary clock signals CLK3–CLK7 from a pair of primary clock signals CLK1 and CLK2. Clock signals CLK1–CLK7 clock various clock sinks 99A–99H. While each clock signal may clock many clock sinks, FIG. 21 shows only a few. The clock signal input to sink 99A resides in the domain of a primary clock signal CLK1 and the clock signal input to sink 99B resides in the domain of a primary clock signal CLK2. Clock signals CLK1 and CLK2 are primary clock signals defining separate clock domains when a netlist does not indicate they are derived from a similar clock signal or that one is derived from another. Any clock sink within the IC clocked by a secondary clock signal derived from a primarily clock resides in a sub-domain of that primary clock's clock domain. For example, clock signals clocking sinks 99C and 99D reside in the same sub-domain of the domain of clock signal CLK1 because they are produced at the same output of clock logic circuit 98A. The clock signals clocking sinks 99E and 99F reside in another sub-domain of the domain of clock signal CLK1 because they are derived from CLK1 by another clock logic circuit 98B. The clock signal input to clock sink 99G is classified as being a "mixed domain" clock signal because it is produced by a clock logic circuit 98C that derives that clock signal from two different primary clock signals CLK1 and CLK2. Clock logic circuit 98C might be multiplexer selectively using either CLK1 or CLK2 to drive CLK5, and in such case, the clock signal input to sink 99G would reside in two different clock domains. The clock signal inputs to sinks 99C and 99D reside in the same sub-domain and are of the same phase because they are both clocked by the same clock signal phase. The clock signal inputs to sinks 99E and 99F reside the same sub-domain because they are derived from the same logic source, but they are of dissimilar phase because a leading clock signal edge clocks sink 99E while a trailing clock signal edge clocks sink 99F.

Having classified each clock sink, clock analysis tool 66 processes the netlist to identify each synchronizing circuit and to determine its type based on relationships between the classifications of the clock signals used to clock the clock sinks of that synchronizing circuit. When it identifies a synchronizing circuit that emulator 69 may not be able to properly emulate, the clock analysis tool 66 automatically modifies the netlist description of the synchronizing circuit, when possible, to allow the emulator 69 to emulate it. Otherwise, when it encounters a problematic synchronizing circuit it cannot revise, clock analysis tool 66 transmits a warning to the user identifying the synchronizing circuit and identifying its type so that the user can take steps to resolve the problem, for example by modifying the netlist description of the synchronizing circuit. The tool identifies each synchronizing circuit as being one of the following of six types labeled A through F.

In a "type A" synchronizing circuit, the same phase of the same clock signal "similar domain, similar sub-domain, similar phase" clocks all input and output clock sinks. Since the emulator will be able to emulate a type A synchronizing circuit, timing analysis tool 66 makes no change to the netlist description of a type A synchronizing circuit. However, if any one of the output sinks is a latch, the tool warns the user that the type A synchronizing circuit may have a design flaw.

In a "type B" synchronizing circuit, clock signals that clock the synchronizing circuit's input and output sinks are of similar domain, dissimilar subdomain and similar phase. Since the emulator cannot emulate a type B synchronizing circuit assigned to this classification, the tool therefore automatically modifies the synchronizing circuit to convert it to a type A synchronizing circuit using one of the approaches discussed above. If any one of the output sinks is a latch, the tool warns the user that the type A synchronizing circuit may have a design flaw.

In a "type C" synchronizing circuit the clock signals that clock the synchronizing circuit's input and output sinks are of similar domain, dissimilar sub-domain and dissimilar phase. The emulator can emulate a type C synchronizing circuit but may have to slow its system clock frequency more than it would for a type A synchronizing circuit. The tool therefore may warn the user that a reduction in emulation speed may be necessary or may modify the type C synchronizing circuit to convert it type A synchronizing circuit.

In "type D" synchronizing circuit the clock signals that clock the input and output sinks are of similar domain, similar subdomain, and dissimilar phase. The emulator will be able to emulate a type D synchronizing circuit and therefore makes no changes to a type D synchronizing circuit.

In a "type E" synchronizing circuit the clock signals that clock input and output sinks are of dissimilar domains. The tool warns the user when it identifies a type E synchronizing circuit.

In a "type F" synchronizing circuit at least one of the clock signals that clock the synchronizing circuit's input and output sinks is derived from more than one primary clock signal. The tool warns the user when it encounters a type F synchronizing circuit.

In a "type G" synchronizing circuit, the signals that clock the input and output sinks are of similar domain and subdomain. However, the signals clocking the input sinks are of "mixed phase" where at least one of the input sinks is clocked on a rising edge and at least one other of the input sinks is clocked on a falling edge. The tool warns the user when it identifies a type G synchronizing circuit.

In a "type H" synchronizing circuit, the signals that clock the input and output sinks are of similar domain, dissimilar sub-domain and of mixed phase. The tool automatically converts a type H synchronizing circuit into a type G synchronizing circuit and then warns the user that it the emulation will include a type G synchronizing circuit.

Figure 22:
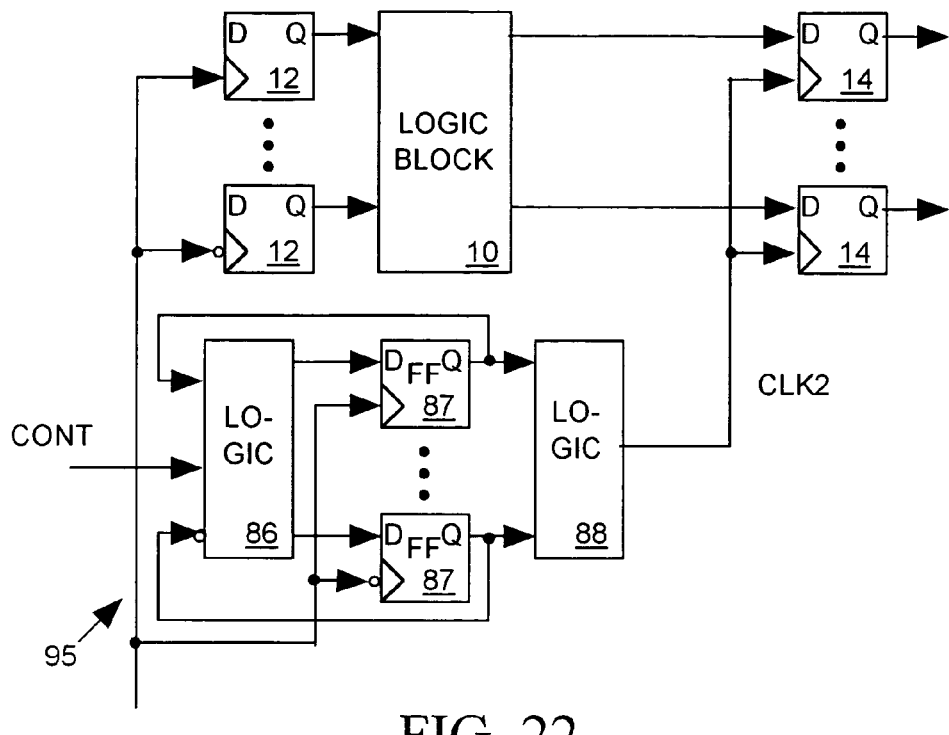
FIGS. 22–25 are block diagrams illustrating clocking systems for a logic block within an IC.
Figure 23:
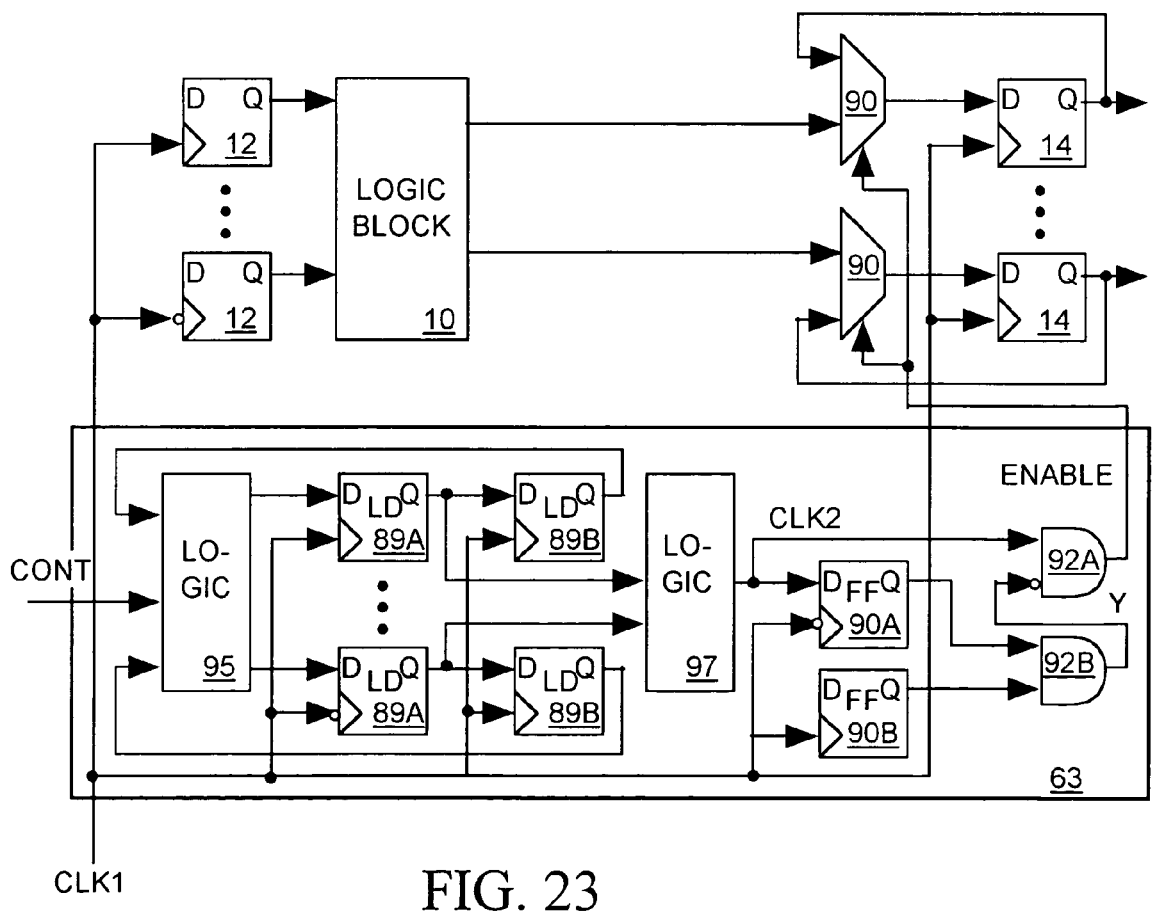

FIG. 22 illustrates a synchronizing circuit that is similar to synchronizing circuit 93 of FIG. 19 except that it has mixed phase signals driving input sinks 12 and the flip-flops 87 included in the clock logic state machine 95. This is a type H synchronizing circuit, and the clock analysis tool can convert this into a type G synchronizing circuit as illustrated in FIG. 23. The synchronizing circuit of FIG. 23 is similar to that of FIG. 20 except that the circuit of FIG. 23 replaces flip-flop 90 with two flip-flops 90A and 90B clocked by different phases of the CLK1 signal and replaces AND gate 92 with two AND gates 92A and 92B.

Figure 24:
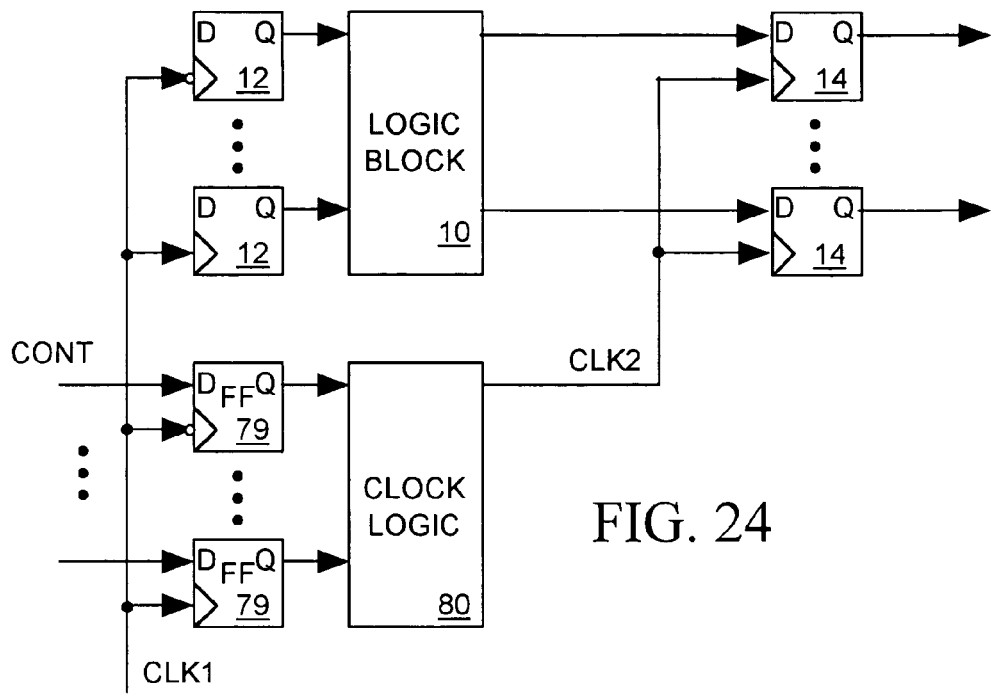
Figure 25:
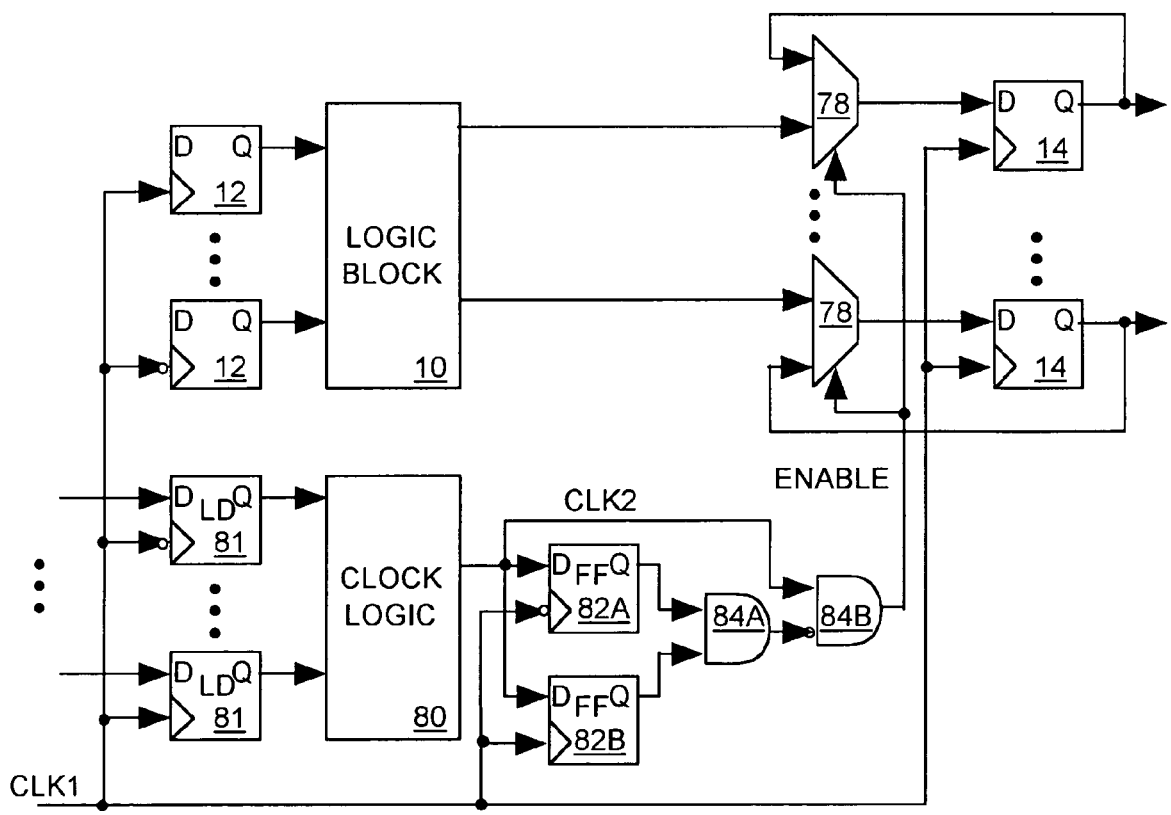

FIG. 24 illustrates another type H synchronizing circuit that is similar to the type B synchronizing circuit 63 of FIG. 17 except that its input sinks have mixed phase clock signals. The clock analysis tool converts the type H synchronizing circuit of FIG. 24 into the type G synchronizing circuit of FIG. 25 which is similar to the type A synchronizing circuit of FIG. 18 except that flip-flop 82 is replaced with two flip-flops 83 and 84 clocked by different phases of the CLK1 signal. Note also that AND gate 84 of FIG. 18 is replaced with two AND gates 84A and 84B in FIG. 24.

Figure 26:
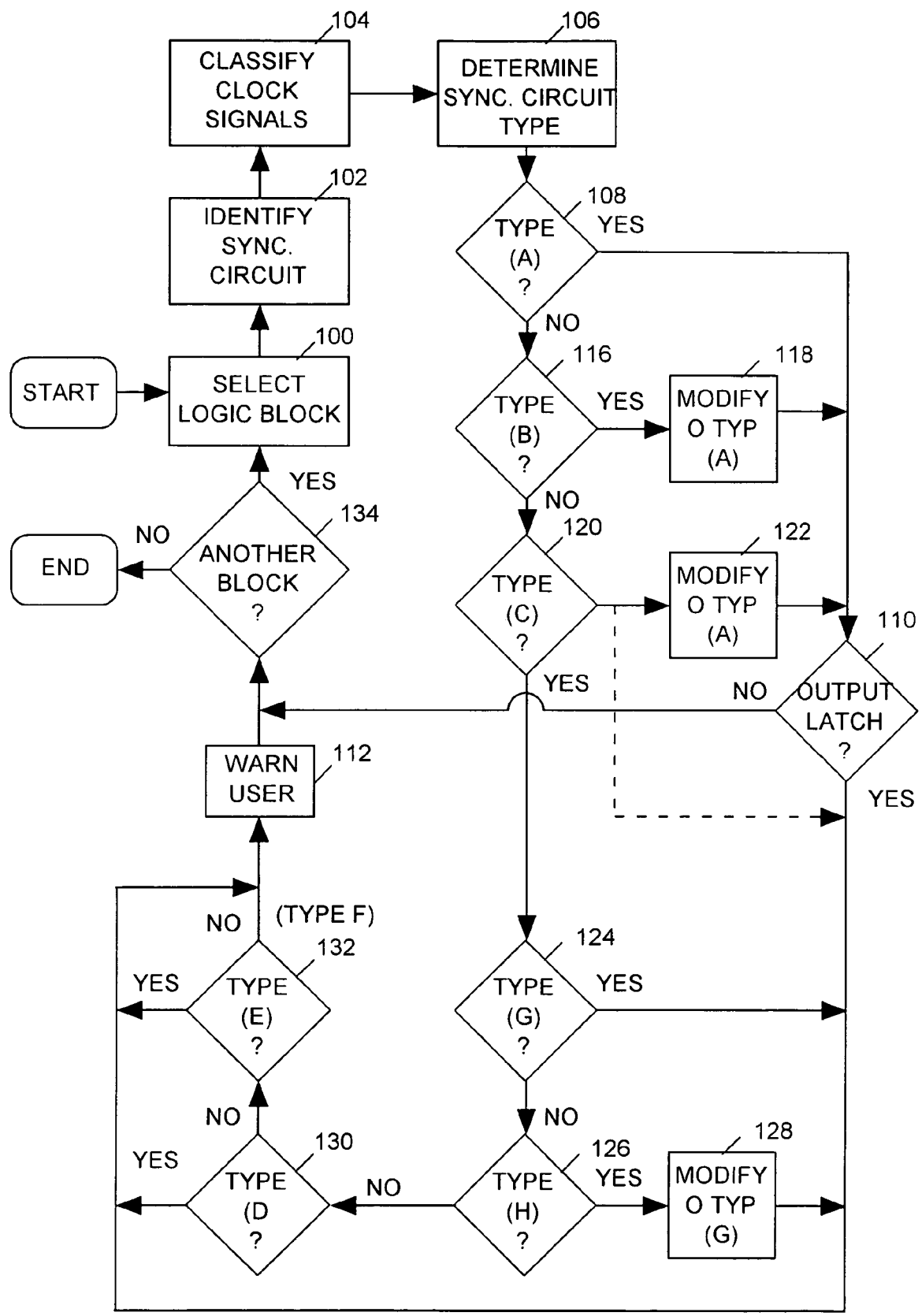
FIG. 26 is a flow chart illustrating an algorithm for a clock analysis tool in accordance with the invention.

FIG. 26 illustrates an algorithm that clock analysis tool 66 of FIG. 13 can use when analyzing netlist 65. The tool initially selects a block of synchronous logic (step 100), identifies its synchronizing circuit (step 102), classifies the clock signals controlling the synchronizing circuit's clock sinks (step 104), and then determines the synchronizing circuit type in accordance with the relationships between its clock signals (step 106).

When the synchronizing circuit is type A (step 108), the emulator will be able to emulate it, and the tool need not modify the netlist description of the synchronizing circuit. The tool then determines whether any of its output clock sinks is a latch (step 110). If so, the synchronizing circuit may have a design flaw and the tool therefore warns the user by identifying the synchronizing circuit and its type and the nature of the design flaw (step 112).

When the synchronizing circuit is type B (step 116), the tool modifies the netlist description of the synchronizing circuit to convert it to a type A synchronizing circuit (step 118). The tool then determines whether any of its output clock sinks is a latch (step 110). If so, the synchronizing circuit may have a design flaw and the tool therefore warns the user by identifying the synchronizing circuit and its type and the nature of the design flaw (step 112).

When the synchronizing circuit is type C, (step 118), the tool may warn the user by identifying the circuit and its type (step 112) or, alternatively, may modify the netlist description of the synchronizing circuit to convert it to a type A synchronizing circuit (step 122). In the latter case, if the synchronizing circuit includes an output latch (step 110), the tool warns the user at step 112.

When the synchronizing circuit is type G (step 124) the tool warns the user that the circuit has mixed phase clock signals (step 112) and will also warn the user at step 112 if the synchronizing circuit includes an output latch.

When the synchronizing circuit is type H (step 126), the tool modifies the circuit to convert it into a type G synchronizing circuit (step 128) and then warns the user that the circuit has mixed phase clock signals (step 112). The tool will also warn the user at step 112 if the synchronizing circuit includes an output latch.

When the synchronizing circuit is type D (step 130), the emulator will be able to emulate it and the tool need make no modifications to the circuit or issue any warnings regarding it.

When the synchronizing circuit is type E (step 132), the tool warns the user by identifying the circuit and its type (step 112). Otherwise, when the synchronizing circuit is type F, the tool warns the user by identifying the circuit and its type (step 112).

After either of steps 110 or 112, the tool looks for another block of synchronous logic (step 134), and if it finds one, selects that logic block at step 100 and then repeats steps 102–132 to identify its synchronizing circuit type and modify the synchronizing circuit or warn the user if necessary. The tool continues to loop through steps 100–134 until it has identified the type of synchronizing circuit for every block of synchronous logic described by the netlist and has appropriately modified the netlist and or warned the user about each problematic synchronizing circuit.

Thereafter, assuming the tool has modified the netlist so that it includes only synchronizer types that can be emulated, the emulation programmer 68 of FIG. 14 can program emulator 69 based on test bench 64 and the revised netlist 67 and emulator 69 will be able to correctly emulate all synchronizing circuits. When the tool has issued warnings about one or more synchronizing circuits, the user may modify netlist 67 as necessary to resolve the synchronizing circuit problems identified by the warnings before emulation programmer 68 programs the emulator.

The foregoing specification and the drawings depict an exemplary embodiment of the best mode of practicing the invention, and elements or steps of the depicted best mode exemplify the elements or steps of the invention as recited in the appended claims. As an aid to understanding the best mode of practicing the invention, the specification describes many details of the best mode even though many details of the best mode need not be present in other modes of practicing the invention. The appended claims are therefore intended to apply to any mode of practicing the invention comprising the combination of elements or steps as described in any one of the claims, including elements or steps that are functional equivalents of the example elements or steps of the exemplary embodiment of the invention depicted in the specification and drawings.

The invention claimed is:

1. A method for programming an emulator to emulate an integrated circuit (IC) clocked by at least one primary clock signal provided as input to the IC, the IC being described by a netlist as including logic blocks that communicate through synchronizing circuits, wherein the synchronizing circuits include input clock sinks for conveying input signals into logic blocks and output clock sinks for conveying output signals out of logic blocks, and wherein the synchronizing circuits employ clock signals derived from the at least one primary clock signal to clock the input and output clock sinks, the method comprising the steps of:
   a. analyzing the netlist to determine a domain, a sub-domain and a phase of each clock signal each synchronizing circuit employs to clock its input and output clock sinks;
   b. analyzing the netlist to determine a type of each synchronizing circuit based on relationships between the determined domain, sub-domain and phase of the clock signals the synchronizing circuit employs to clock its input and output sinks, wherein synchronizing circuit types comprise:
      at least one type A synchronizing circuit wherein clock signals that clock the synchronizing circuit's input and output clock sinks are derived from at the least one primary clock signal provided as input to the IC and are of similar domain, similar sub-domain and similar phase, and
      at least one type B synchronizing circuit wherein clock signals that clock the synchronizing circuit's input and output sinks are derived from the at least one primary clock signal provided as input to the IC and are of similar domain, dissimilar subdomain, and similar phase, and
   c. modifying the netlist description of each type B synchronizing circuit so that it becomes a type A synchronizing circuit wherein clock signals that clock the synchronizing circuit's input and output sinks are derived from the at least one primary clock signal provided as input to the IC and are of similar domain, similar subdomain, and similar phase.

2. The method in accordance with claim 1
   wherein the synchronizing circuits further comprise at least one type C synchronizing circuit wherein clock signals that clock the synchronizing circuit's input and output clock sinks are of similar domain, dissimilar sub-domain and dissimilar phase, and
   wherein the method further comprises the step of
   d. modifying the netlist description of the type C synchronizing circuit so that it becomes a type A synchronizing circuit.

3. The method in accordance with claim 1
   wherein synchronizing circuit types further comprise at least one type C synchronizing circuit wherein clock signals that clock the synchronizing circuit's input and output clock sinks are of similar domain, dissimilar sub-domain and dissimilar phase, and
   wherein the method further comprises the step of
   d. providing an output identifying each type C synchronizing circuit.

4. The method in accordance with claim 1
   wherein the synchronizing circuits further comprise at least one type D synchronizing circuit wherein clock signals that clock the synchronizing circuit's input and output clock sinks are of similar domain, similar sub-domain and dissimilar phase, and
   wherein the method further comprises the step of
   d. analyzing the netlist to determine whether any type D synchronizing circuit has at least one latch as an output clock sink, and
   e. providing an output identifying each type D synchronizing circuit having a latch as an output sink.

5. The method in accordance with claim 1
   wherein the synchronizing circuits further comprise at least one type E synchronizing circuit wherein clock signals that clock the synchronizing circuit's input and output clock sinks are of dissimilar domain, and
   wherein the method further comprises the step of:
   d. providing an output identifying each type E synchronizing circuit.

6. The method of claim 1
   wherein the synchronizing circuits further comprise at least one type F synchronizing circuit wherein at least one of clock signal clocking any one of the synchronizing circuit's input and output clock sinks resides in more than one clock domain, and
   d. providing an output identifying each type F synchronizing circuit.

7. The method in accordance with claim 1
   wherein at least one type B synchronizing circuit comprises:
      a least one input sink for clocking at least one input signal into one of said logic blocks in response to a first clock signal;
      at least one output sink for clocking at least one output signal out of said one of said logic blocks in response to the second clock signal; and
      a clock logic circuit for generating the second clock signal in response to the first clock signal and at least one clock control signal, and
   wherein step c comprises modifying the netlist description of the at least one type B synchronizing circuit so that the clock logic circuit generates an enable signal that is a function of the at least one clock control signal, and to convert each of its output clock sinks to an enabled clock sink, wherein each enabled clock sink is clocked by the first clock signal when enabled by the enable signal.

8. The method in accordance with claim 1
   wherein the at least one type B synchronizing circuit comprises:
      a least one input sink for clocking at least one input signal into one of said logic blocks in response to a first clock signal;
      at least one output sink for clocking at least one output signal out of said one of said logic blocks in response to a second clock signal; and
      a clock logic circuit for generating the second clock signal in response to the first clock signal and at least one clock control signal, wherein the clock logic circuit includes at least one flip-flop clocked by the first clock signal, and
   wherein step c comprises modifying the netlist description of the at least one type B synchronizing circuit, to convert each flip-flop of the clock logic circuit into a latch, to add a circuit for generating an enable signal in response to a logical combination of the first and second clock signals, and to convert each of the synchronizing circuit's output clock sinks to an enabled output clock sink clocked by the first clock signal only when enabled by the enable signal.

9. The method in accordance with claim 8 wherein the clock logic circuit is a state machine.

10. The method in accordance with claim 1 further comprising the step of
   d. programming the emulator to emulate an IC described by the netlist as modified at step c.

11. The method in accordance with claim 2 further comprising the step of
   e. programming the emulator to emulate an IC described by the netlist as modified at steps c and d.

12. The method in accordance with claim 1
   wherein the synchronizing circuit types further comprise a type G synchronizing circuit wherein clock signals that clock the input and output sinks are of similar domain and sub-domain and wherein at least one of the input sinks is clocked on a rising edge and at least one other of the input sinks is clocked on a falling edge, and
   wherein the method further comprises the step of
   d. providing an output identifying each type G synchronizing circuit.

13. The method in accordance with claim 12
   wherein the synchronizing circuit types further comprise a type H synchronizing circuit wherein clock signals that clock the input and output sinks are of similar domain and dissimilar sub-domain and wherein at least one of the input sinks is clocked on a rising edge and at least one other of the input sinks is clocked on a falling edge, and
   wherein the method further comprises the step of
   e. modifying the netlist description of each type H synchronizing circuit so that it becomes a type G synchronizing circuit.

14. Computer-readable media storing instructions which, when read and executed by a computer causes the computer to carry out a method for programming an emulator to emulate an integrated circuit (IC) clocked by at least one primary clock signal provided as input to the IC, the IC being described by a netlist as including logic blocks that communicate through synchronizing circuits, wherein the synchronizing circuits include input clock sinks for conveying input signals into logic blocks and output clock sinks for conveying output signals out of logic blocks, and wherein the synchronizing circuits employ clock signals derived from the at least one primary clock signal to clock the input and output clock sinks, the method comprising the steps of:
   a. analyzing the netlist to determine a domain, a sub-domain and a phase of each clock signal each synchronizing circuit employs to clock its input and output clock sinks;
   b. analyzing the netlist to determine a type of each synchronizing circuit based on relationships between the determined domain, sub-domain and phase of the clock signals the synchronizing circuit employs to clock its input and output sinks, wherein synchronizing circuit types comprise:
      at least one type A synchronizing circuit wherein clock signals that clock the synchronizing circuit's input and output clock sinks are derived from at the least one primary clock signal provided as input to the IC and are of similar domain, similar sub-domain and similar phase, and
      at least one type B synchronizing circuit wherein clock signals that clock the synchronizing circuit's input and output sinks are derived from the at least one primary clock signal provided as input to the IC and are of similar domain, dissimilar subdomain, and similar phased and
   c. modifying the netlist description of each type B synchronizing circuit so that it becomes a type A synchronizing circuit wherein clock signals that clock the synchronizing circuit's input and output sinks are derived from the at least one primary clock signal provided as input to the IC and are of similar domain, similar sub-domain, and similar phase.

15. The computer-readable media in accordance with claim 14
   wherein the synchronizing circuits further comprise at least one type C synchronizing circuit wherein clock signals that clock the synchronizing circuit's input and output clock sinks are of similar domain, dissimilar sub-domain and dissimilar phase, and
   wherein the method further comprises the step of
   d. modifying the netlist description of the C synchronizing circuit so that it becomes a type A synchronizing circuit.

16. The computer-readable media in accordance with claim 14
   wherein synchronizing circuit types further comprise at least one type C synchronizing circuit wherein clock signals that clock the synchronizing circuit's input and output clock sinks are of similar domain, dissimilar sub-domain and dissimilar phase, and
   wherein the method further comprises the step of
   d. providing an output identifying each type C synchronizing circuit.

17. The computer-readable media in accordance with claim 14
   wherein the synchronizing circuits further comprise at least one type D synchronizing circuit wherein clock signals that clock the synchronizing circuit's input and output clock sinks are of similar domain, similar sub-domain and dissimilar phase, and
   wherein the method further comprises the step of
   d. analyzing the netlist to determine whether any type D synchronizing circuit has at least one latch as an output clock sink, and
   e. providing an output identifying each type D synchronizing circuit having a latch as an output sink.

18. The computer-readable media in accordance with claim 14
   wherein the synchronizing circuits further comprise at least one type E synchronizing circuit wherein clock signals that clock the synchronizing circuit's input and output clock sinks are of dissimilar domain, and
   wherein the method further comprises the step of:
   d. providing an output identifying each type E synchronizing circuit.

19. The computer-readable media of claim 14
   wherein the synchronizing circuits further comprise at least one type F synchronizing circuit wherein at least one of clock signal clocking any one of the synchronizing circuit's input and output clock sinks resides in more than one clock domain, and
   wherein the method further comprises:
   d. providing on output identifying each type F synchronizing circuit.

20. The computer-readable media in accordance with claim 14
   wherein at least one type B synchronizing circuit comprises:

a least one input sink for clocking at least one input signal into one of said logic blocks in response to a first clock signal;

at least one output sink for clocking at least one output signal out of said one of said logic blocks in response to the second clock signal; and a clock logic circuit for generating the second clock signal in response to the first clock signal and at least one clock control signal, and wherein step c comprises modifying the netlist description of the at least one type B synchronizing circuit so that the clock logic circuit generates an enable signal that is a function of the at least one clock control signal, and to convert each of its output clock sinks to an enabled clock sink, wherein each enabled clock sink is clocked by the first clock signal when enabled by the enable signal.

21. The computer-readable media in accordance with claim 14 wherein the at least one type B synchronizing circuit comprises:

a least one input sink for clocking at least one input signal into one of said logic blocks in response to a first clock signal;

at least one output sink for clocking at least one output signal out of said one of said logic blocks in response to a second clock signal; and a clock logic circuit for generating the second clock signal in response to the first clock signal and at least one clock control signal, wherein the clock logic circuit includes at least one flip-flop clocked by the first clock signal, and wherein step c comprises modifying the netlist description of the at least one type B synchronizing circuit, to convert each flip-flop of the clock logic circuit into a latch, to add a circuit for generating an enable signal in response to a logical combination of the first and second clock signals, and to convert each of the synchronizing circuit's output clock sinks to an enabled output clock sink clocked by the first clock signal only when enabled by the enable signal.

22. The computer-readable media in accordance with claim 21 wherein the clock logic circuit is a state machine.

23. The computer-readable media in accordance with claim 14 wherein the method further comprises the step of d. programming the emulator to emulate an IC described by the netlist as modified at step c.

24. The computer-readable media in accordance with claim 23 wherein the method further comprises the step of e. programming the emulator to emulate an IC described by the netlist as modified at steps c and d.

25. The computer-readable media in accordance with claim 14 wherein the synchronizing circuit types further comprise a type G synchronizing circuit wherein clock signals that clock the input and output sinks are of similar domain and sub-domain and wherein at least one of the input sinks is clocked on a rising edge and at least one other of the input sinks is clocked on a falling edge, and wherein the method further comprises the step of d. providing an output identifying each type G synchronizing circuit.

26. The computer-readable media in accordance with claim 25 wherein the synchronizing circuit types further comprise a type H synchronizing circuit wherein clock signals that clock the input and output sinks are of similar domain and dissimilar sub-domain and wherein at least one of the input sinks is clocked on a rising edge and at least one other of the input sinks is clocked on a falling edge, and wherein the method further comprises the step of e. modifying the netlist description of each type H synchronizing circuit so that it becomes a type G synchronizing circuit.

* * * * *